(12) United States Patent
Gibbons et al.

(10) Patent No.: US 7,888,255 B2
(45) Date of Patent: Feb. 15, 2011

(54) METHOD OF FORMING AN ANTIFUSE AND A CONDUCTIVE INTERCONNECT, AND METHODS OF FORMING DRAM CIRCUITRY

(75) Inventors: Jasper Gibbons, Boise, ID (US); Darren Young, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 12/762,766

(22) Filed: Apr. 19, 2010

(65) Prior Publication Data
US 2010/0203719 A1  Aug. 12, 2010

Related U.S. Application Data

(63) Continuation of application No. 12/052,607, filed on Mar. 20, 2008, now Pat. No. 7,713,857.

(51) Int. Cl.
*H01L 21/44* (2006.01)
*H01L 21/3205* (2006.01)
*H01L 21/4763* (2006.01)
*H01L 21/82* (2006.01)
*H01L 21/336* (2006.01)

(52) U.S. Cl. ............... 438/600; 438/299; 438/587; 438/129; 438/664

(58) Field of Classification Search ............... 438/600, 438/218, 299, 587, 664, 601, 215, 467, 130, 438/131, 132, 281, 129, 957, 466
See application file for complete search history.

(56) References Cited

U.S. PATENT DOCUMENTS

| | | | |
|---|---|---|---|
| 5,527,745 | A | 6/1996 | Dixit et al. |
| 5,920,109 | A | 7/1999 | Hawley et al. |
| 6,291,871 | B1 | 9/2001 | Dennison |
| 6,335,228 | B1 | 1/2002 | Fuller et al. |
| 6,642,150 | B1 * | 11/2003 | Huang et al. ............ 438/714 |
| 6,704,235 | B2 | 3/2004 | Knall et al. |
| 6,815,264 | B2 | 11/2004 | Stribley et al. |
| 6,841,846 | B1 | 1/2005 | Chen et al. |
| 6,861,727 | B2 | 3/2005 | Forbes et al. |

(Continued)

OTHER PUBLICATIONS

Huang et al., "A New CMOS Logic Anti-Fuse Cell with Programmable Contact", IEEE, pp. 48-51, 2007.

*Primary Examiner*—Chuong A. Luu
(74) *Attorney, Agent, or Firm*—Wells St. John P.S.

(57) ABSTRACT

A first via opening is formed to a first conductor and a second via opening is formed to a second conductor. The first and second via openings are formed through insulative material. Then, the first conductor is masked from being exposed through the first via opening and to leave the second conductor outwardly exposed through the second via opening. An antifuse dielectric is formed within the second via opening over the exposed second conductor while the first conductor is masked. Then, the first conductor is unmasked to expose it through the first via opening. Then, conductive material is deposited to within the first via opening in conductive connection with the first conductor to form a conductive interconnect within the first via opening to the first conductor and to within the second via opening over the antifuse dielectric to form an antifuse comprising the second conductor, the antifuse dielectric within the second via opening and the conductive material deposited to within the second via opening. Other aspects are contemplated.

21 Claims, 21 Drawing Sheets

U.S. PATENT DOCUMENTS

| | | |
|---|---|---|
| 6,897,542 B2 | 5/2005 | Dennison |
| 6,903,437 B1 | 6/2005 | Manning |
| 7,026,217 B1 | 4/2006 | Kamath et al. |
| 7,226,816 B2 | 6/2007 | Bertin et al. |
| 7,268,384 B2 | 9/2007 | Parekh et al. |
| 7,713,857 B2 * | 5/2010 | Gibbons et al. ............. 438/600 |
| 2007/0257331 A1 | 11/2007 | Kurjanowicz et al. |

* cited by examiner

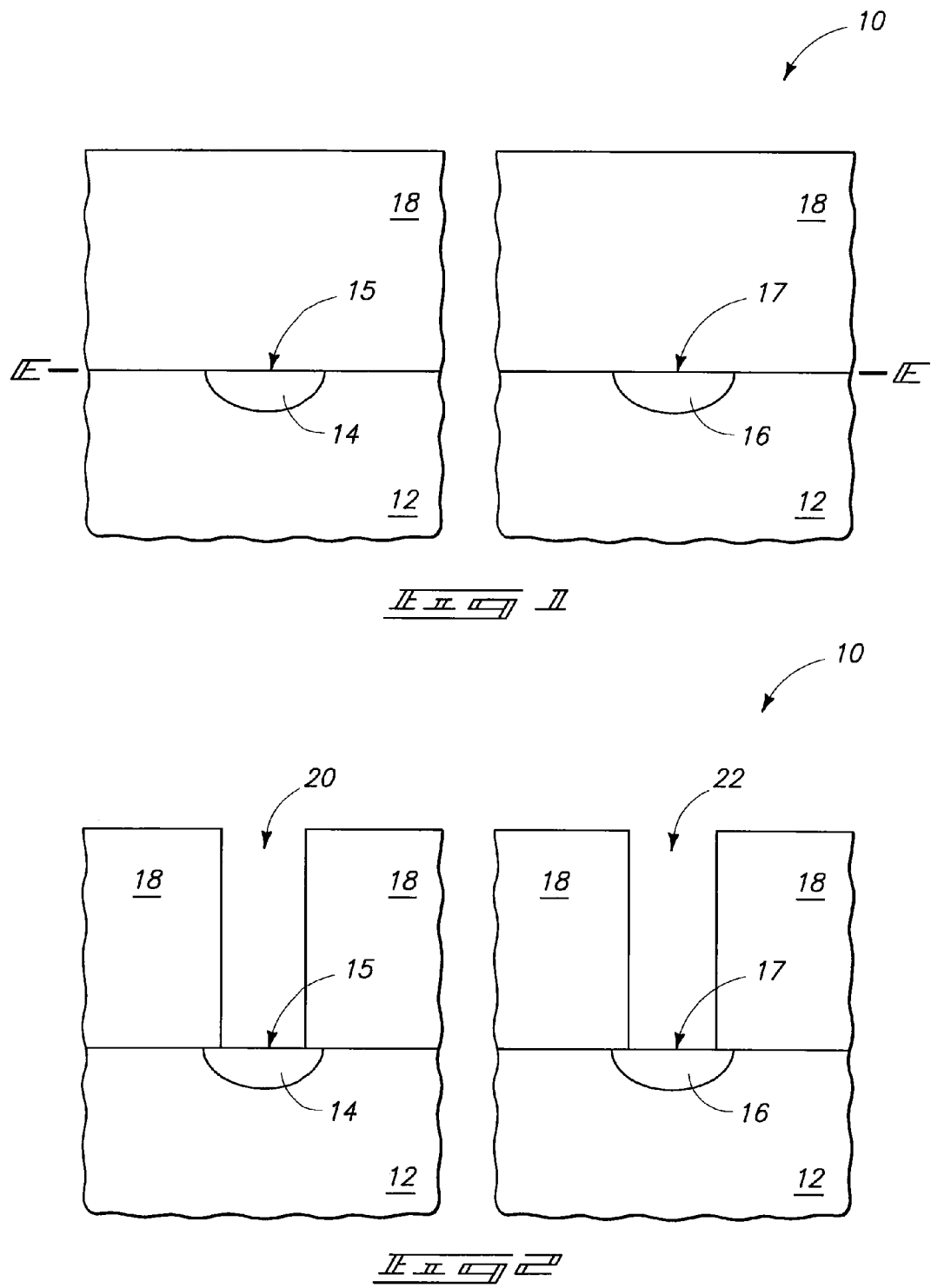

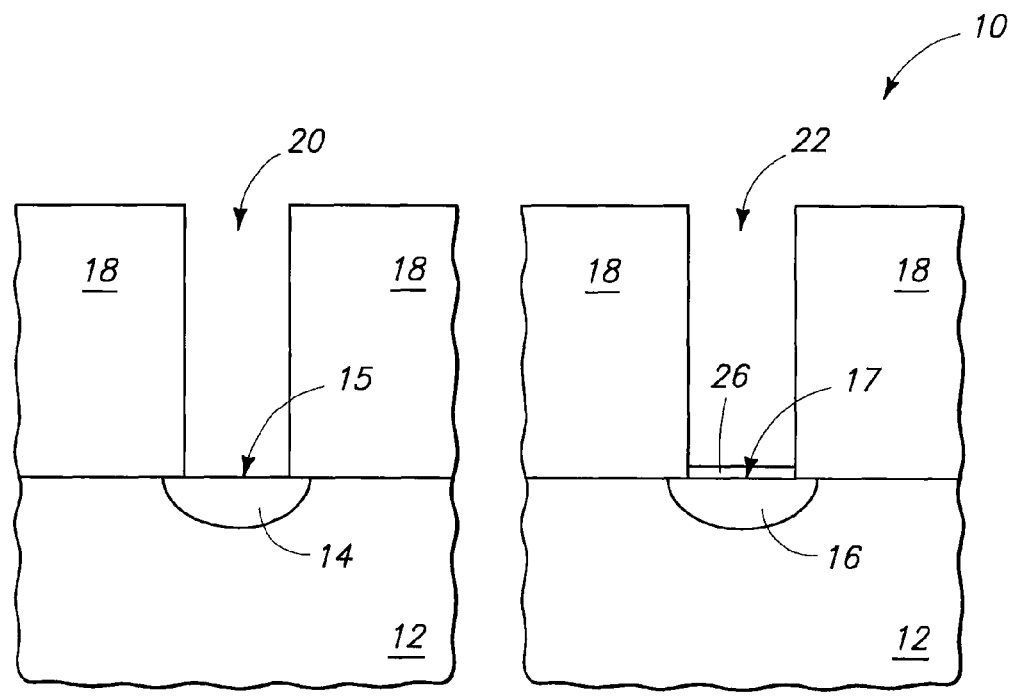
_Fig. 5_
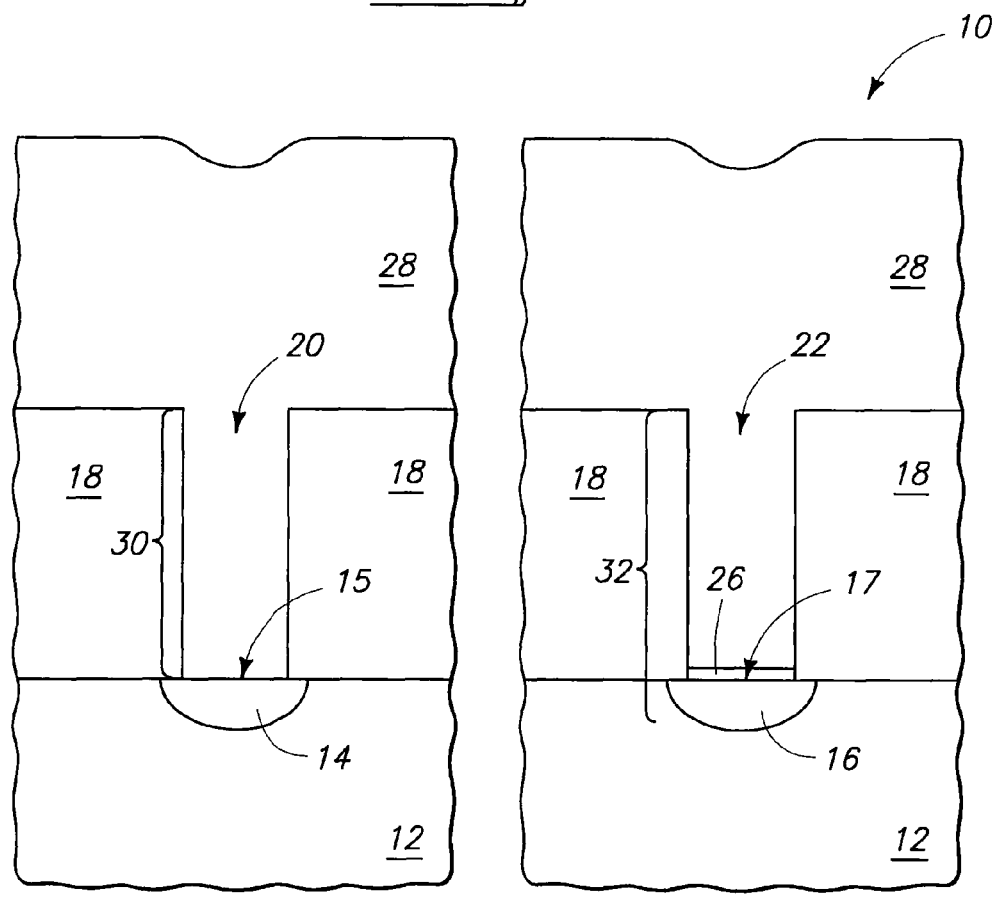
_Fig. 6_

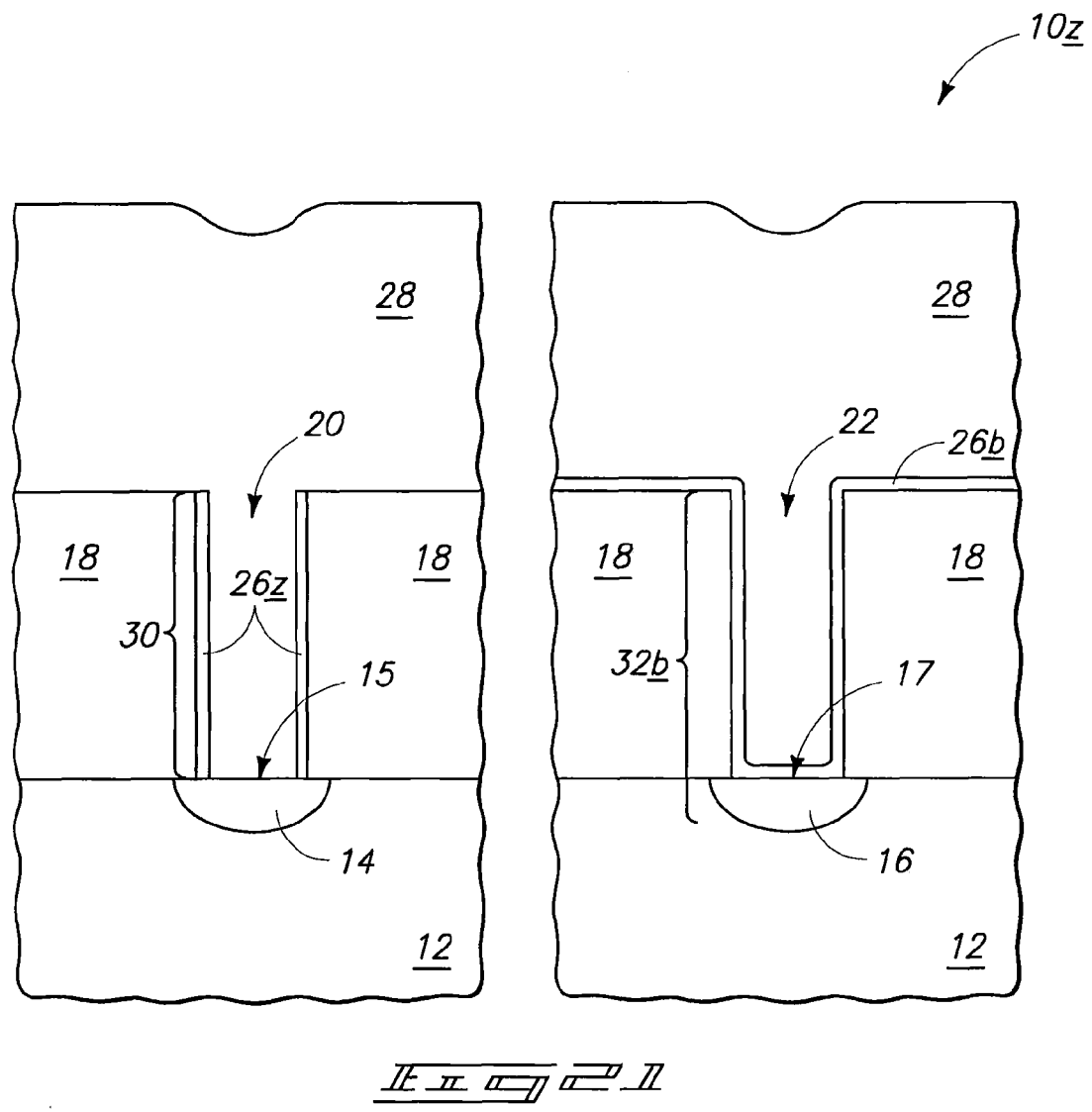

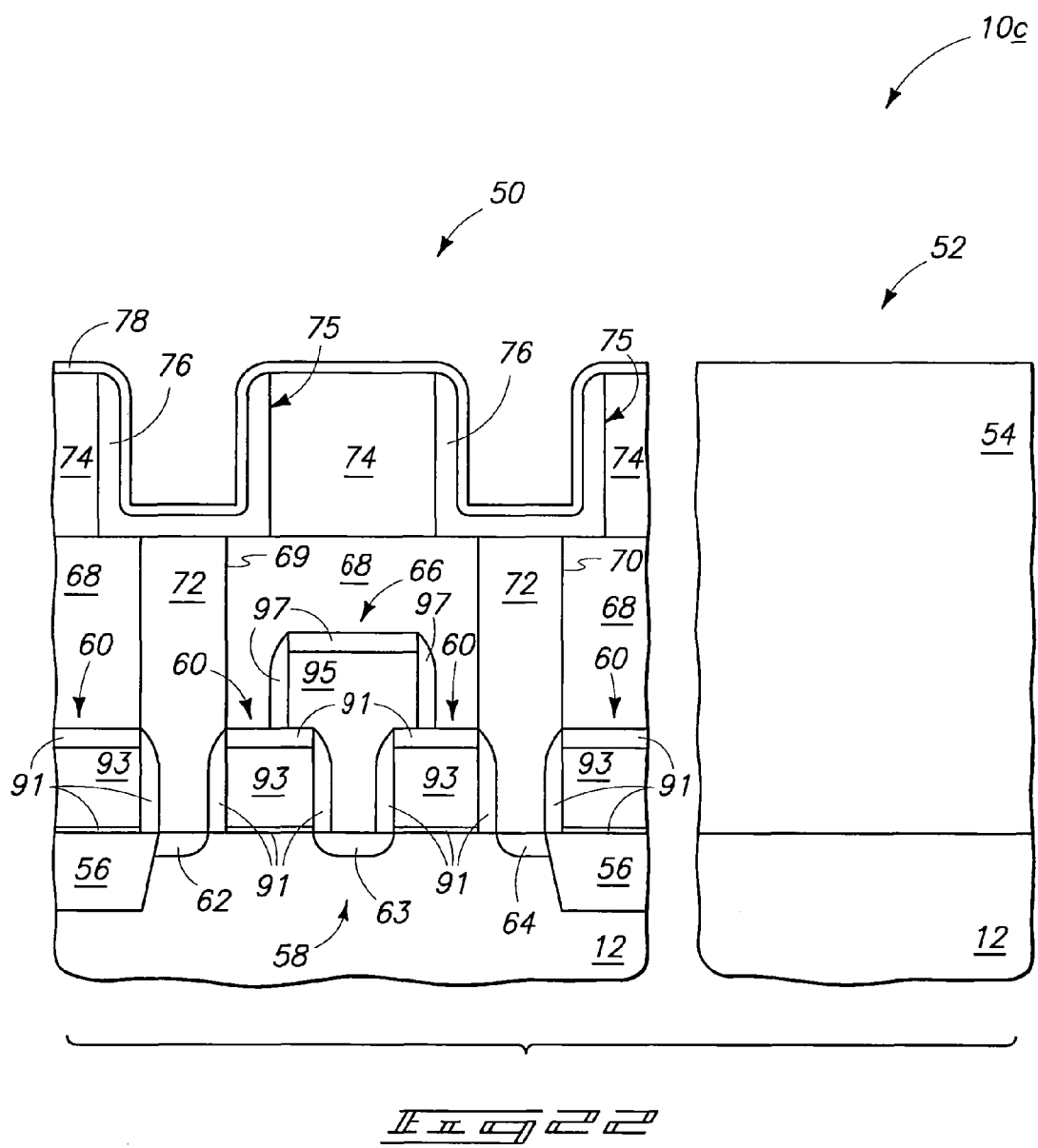

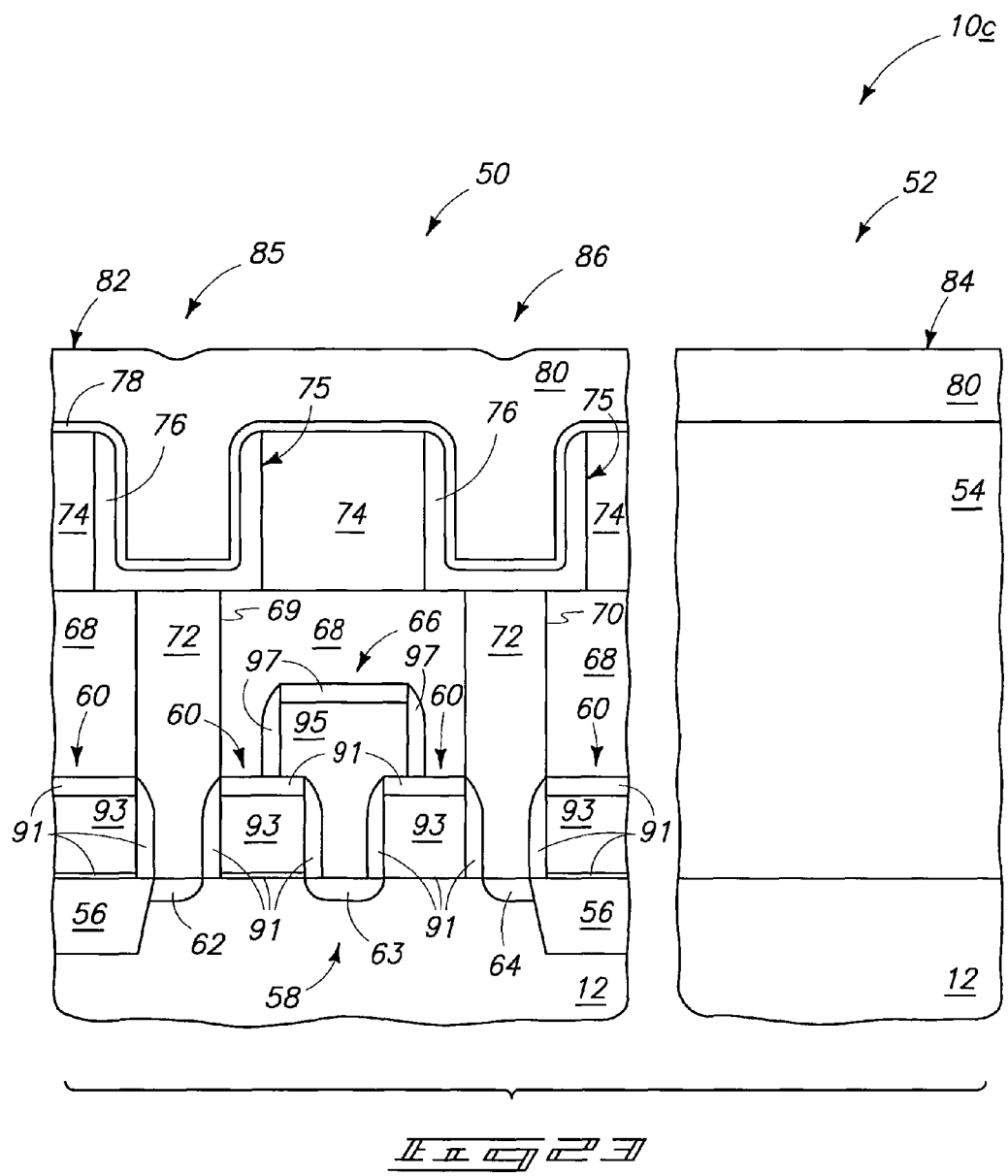

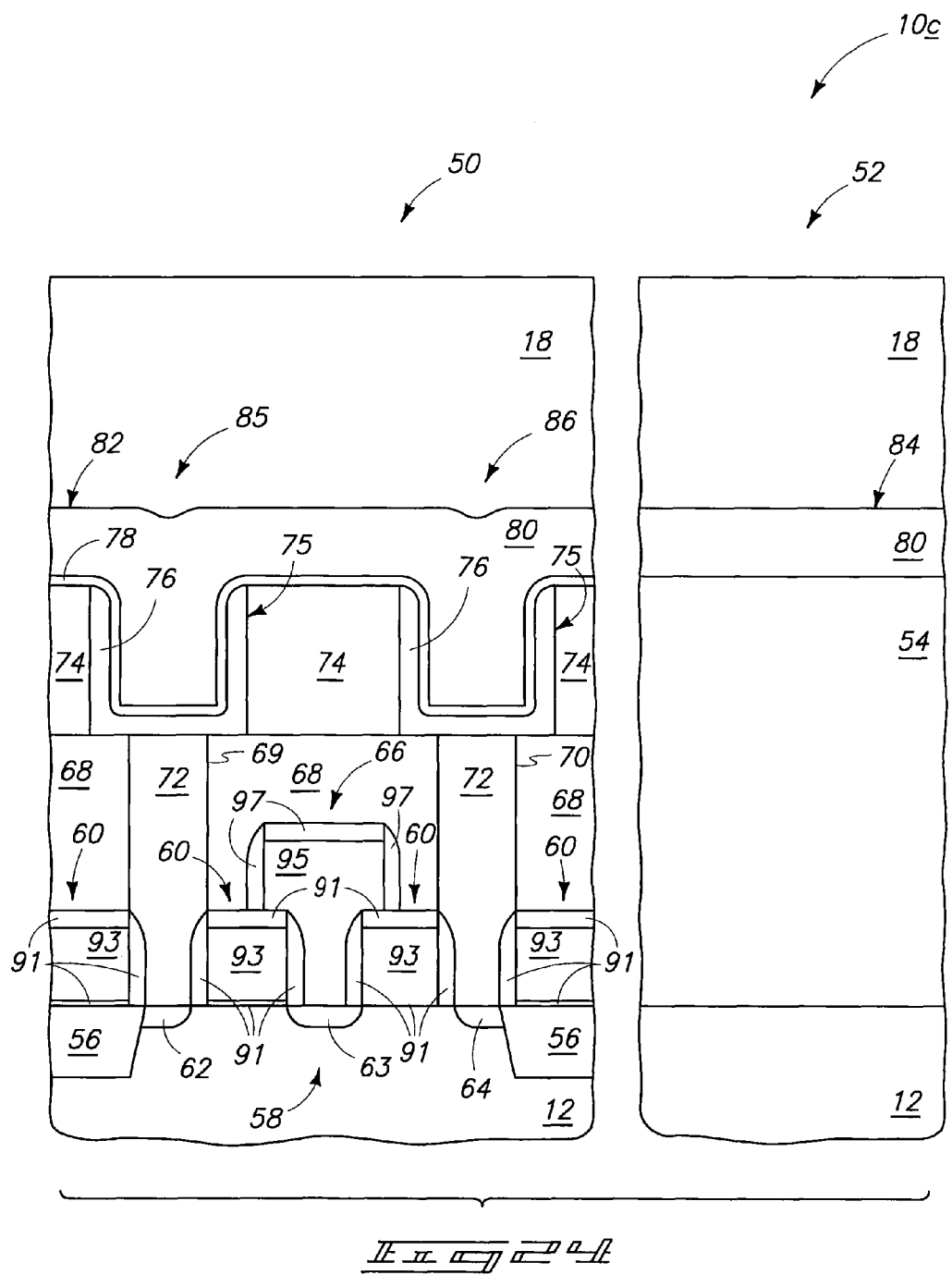

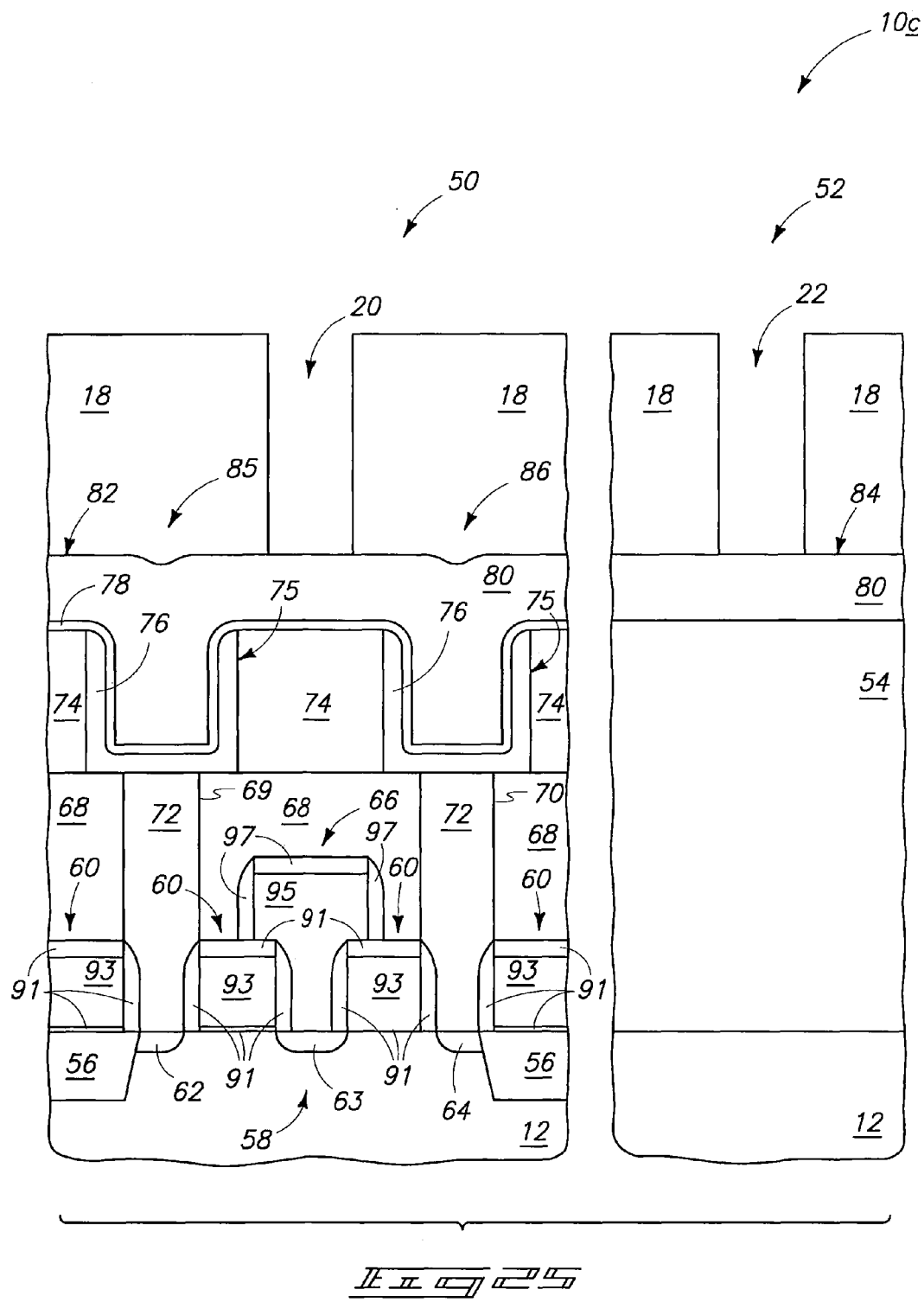

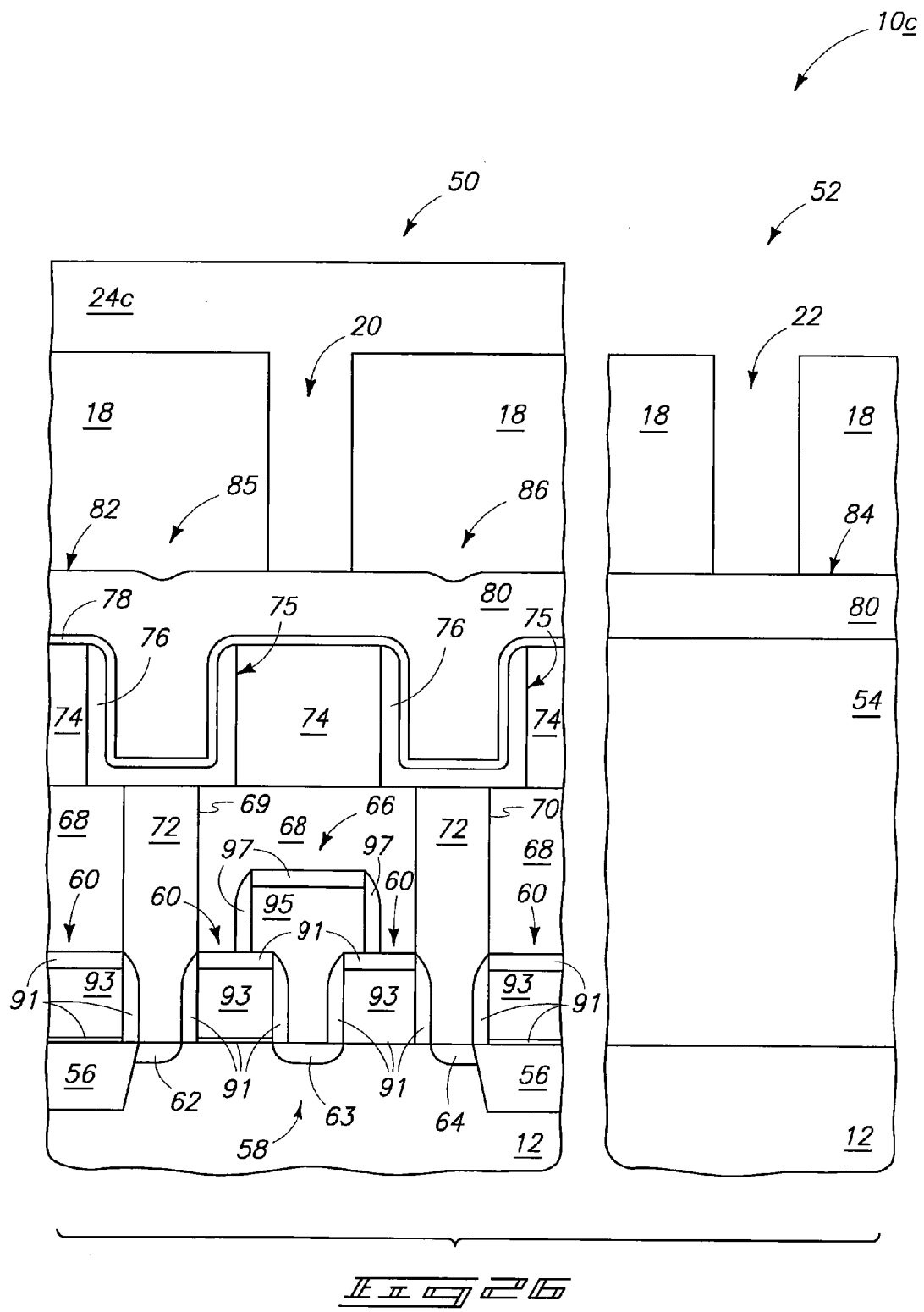
F I G 2 6

METHOD OF FORMING AN ANTIFUSE AND A CONDUCTIVE INTERCONNECT, AND METHODS OF FORMING DRAM CIRCUITRY

RELATED PATENT DATA

This patent resulted from a continuation application of U.S. patent application Ser. No. 12/052,607, filed Mar. 20, 2008 now U.S. Pat. No. 7,713,857, entitled "Method of Forming an Antifuse and a Conductive Interconnect, and Methods of Forming DRAM Circuitry", naming Jasper Gibbons and Darren Young as inventors, the disclosure of which is incorporated by reference.

TECHNICAL FIELD

Embodiments disclosed herein pertain to methods of forming an antifuse and a conductive interconnect, and to methods of forming DRAM circuitry.

BACKGROUND

DRAM circuits include an array of memory cells arranged in rows and columns. Each of the rows and columns is driven by a respective row decoder and column decoder. Often, the memory circuits include several redundant rows and columns that are used as substitutes for defective locations in the memory array.

In the manufacture of DRAM and other integrated circuitry, redundant circuit elements are often provided in the event not all the circuitry or components prove operable upon testing. Thus, if some portion of the circuitry is inoperable, backup circuitry is available for proper operation of the integrated circuit. One manner of providing for such circuit redundancy may be achieved by using antifuses and redundant circuit logic for activating ("blowing") such antifuses. An antifuse is essentially the opposite of a fuse. Fuses are conductive in an un-blown state, and become non-conductive barriers to current flow upon being "blown". Antifuses, on the other hand, block current flow in the un-blown state, and become conductive upon being "blown". Antifuses are composed of a pair of conductors separated by any suitable dielectric. To "blow" the antifuse, a certain level or quanta of charge ($Q_{BD}$) is passed through the antifuse dielectric to cause a physical breakdown of the intervening antifuse dielectric material. Such creates permanent electrically conductive paths between the conductive elements, thus forming a desired electrically conductive short. In antifuse operation, upon initial application of voltage suitable to cause an initial short through the antifuse dielectric, the initial conductive path which is formed may not be sufficient. Accordingly, a suitable "soak" current is applied across the blown dielectric to cause further intermixing or diffusion of the two conductors through the dielectric to assure making a suitable conductive path through the antifuse dielectric.

Accordingly, $Q_{BD}$ and soak current values where it is desired to blow an antifuse are impacted by the antifuse dielectric material, its dimensions, and physical design of the antifuse. Dielectrics are also used in other electronic devices, such as a capacitor dielectric in a capacitor and as a gate dielectric in the gate of a field effect transistor. Dielectric properties for one or both of capacitors and transistor gates for optimization of capacitors or transistor gates might result in undesired ($Q_{BD}$) and soak current values of desired antifuse constructions.

BRIEF DESCRIPTION OF THE DRAWINGS

FIG. 1 is a diagrammatic sectional view of a wafer fragment in process in accordance with an embodiment of the invention.

FIG. 2 is a view of the FIG. 1 wafer fragment at a processing step subsequent to that shown by FIG. 1.

FIG. 5 is a view of the FIG. 1 wafer fragment at a processing step subsequent to that shown by FIG. 4.

FIG. 6 is a view of the FIG. 1 wafer fragment at a processing step subsequent to that shown by FIG. 5.

FIG. 21 is a view of the FIG. 20 wafer fragment at a processing step subsequent to that shown by FIG. 20.

FIG. 22 is a diagrammatic sectional view of yet another wafer fragment in process in accordance with an embodiment of the invention.

FIG. 23 is a view of the FIG. 22 wafer fragment at a processing step subsequent to that shown by FIG. 22.

FIG. 24 is a view of the FIG. 22 wafer fragment at a processing step subsequent to that shown by FIG. 23.

FIG. 25 is a view of the FIG. 22 wafer fragment at a processing step subsequent to that shown by FIG. 24.

FIG. 26 is a view of the FIG. 22 wafer fragment at a processing step subsequent to that shown by FIG. 25.

DETAILED DESCRIPTION OF EXAMPLE EMBODIMENTS

Figure 3:
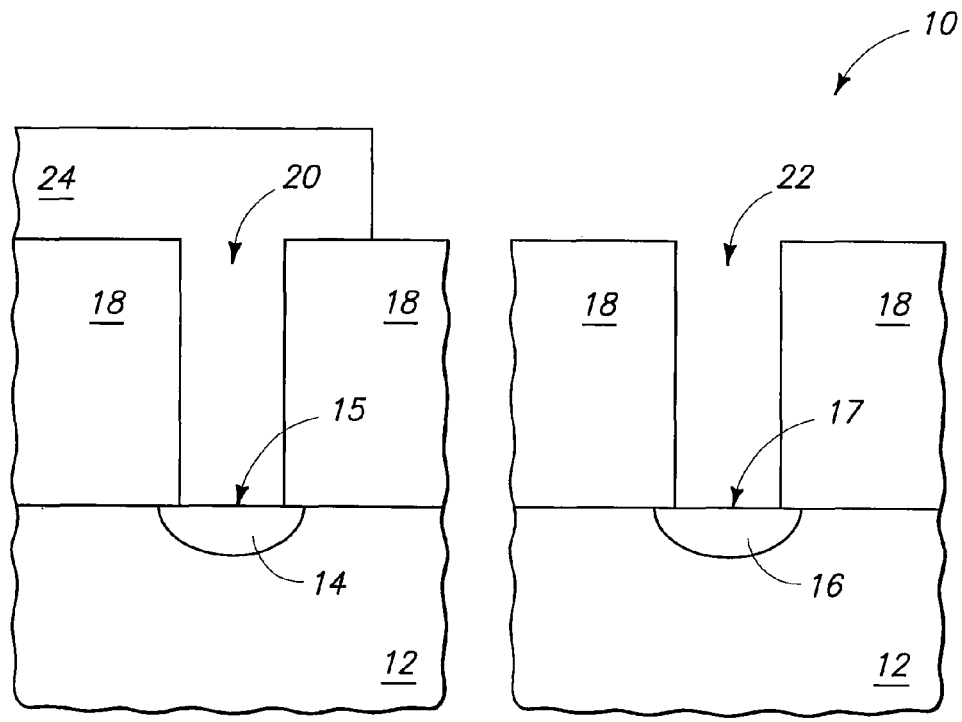
FIG. 3 is a view of the FIG. 1 wafer fragment at a processing step subsequent to that shown by FIG. 2.

First example embodiments of methods of forming an antifuse and a conductive interconnect are described with reference to FIGS. 1-7. Referring initially to FIG. 1, a substrate, for example a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 10 is depicted as comprising some base substrate 12 comprising a first conductor 14 and a second conductor 16 which are spaced from one another. Base substrate 12 might comprise one material or multiple different materials and/or layers. In the depicted example, first and second conductors 14, 16, respectively, are shown as comprising conductive diffusion regions, for example formed by ion implanting conductivity enhancing impurity within semiconductive material, for example bulk semiconductive material such as monocrystalline silicon. However of course, first and second conductors 14, 16, respectively, might comprise any other existing or yet-to-be developed conductive node on a substrate. By way of example only, one or both of the first and second conductors might be conductive metal lines such as interconnect lines, transistor gate lines, as well as components of any electronic device such as a capacitor electrode, a transistor source/drain region, a diode, a resistor, etc.

FIG. 1 depicts a material 18 received over first and second conductors 14, 16. Such might be homogenous or non-homogenous and thereby possibly comprising multiple different materials and/or layers, and will comprise at least some insulative material.

Referring to FIG. 2, a first via opening 20 has been formed to first conductor 14 and a second via opening 22 has been formed to second conductor 16 through insulative material of material 18. By way of example only, such might be formed by a masking step, for example, utilizing photolithographic patterning and etch using photoresist. In one embodiment, first via opening 20 and second via opening 22 are formed using a single masking step, and in one embodiment are formed by etching the insulative material of material 18 at the same time. Regardless, first and second conductors 14, 16 are depicted as comprising respective outermost surfaces 15, 17 which are received at a same or common elevation E relative to substrate 10 and to which respective first and second via openings 20 and 22 extend. Alternately, the respective outermost surfaces of the first and second conductors might be received at different respective elevations (not shown) relative to the substrate and to which the respective first and second via openings extend. Further and regardless, it is likely that multiple additional via openings would also be formed over the substrate commensurate with the forming of depicted via openings 20, 22.

Referring to FIG. 3, first conductor 14 has been masked from being exposed through first via opening 20 and to leave second conductor 16 outwardly exposed through second via opening 22. FIG. 3 depicts one embodiment whereby such has occurred by deposition and patterning of a masking material 24. An example material 24 comprises a photoresist, although any suitable masking material might be utilized, and whether insulative, conductive, or semiconductive in certain embodiments where, for example, masking material 24 will subsequently be completely removed from the substrate. Multiple materials might also be used. FIG. 3 depicts an embodiment whereby masking material 24 has been deposited to bridge across first via opening 20, and also wherein masking material 24 is received within first via opening 20. Alternately by way of example only, masking may be provided whereby no material is deposited to within first via opening 20 and to not be bridging across first via opening 20 outwardly of material 18. FIG. 3 also depicts masking material 24 as being deposited to physically contact first conductor 14. Further by way of example only, masking material might be provided to mask first conductor 14 by providing masking material within the first via opening 20 without any such masking material being received outwardly of material 18. As a further alternate example, a thin layer of masking material might be deposited to line the sidewalls and outermost surface of first conductor 14 within first via opening 20 without entirely filling first via opening 20.

Figure 4:
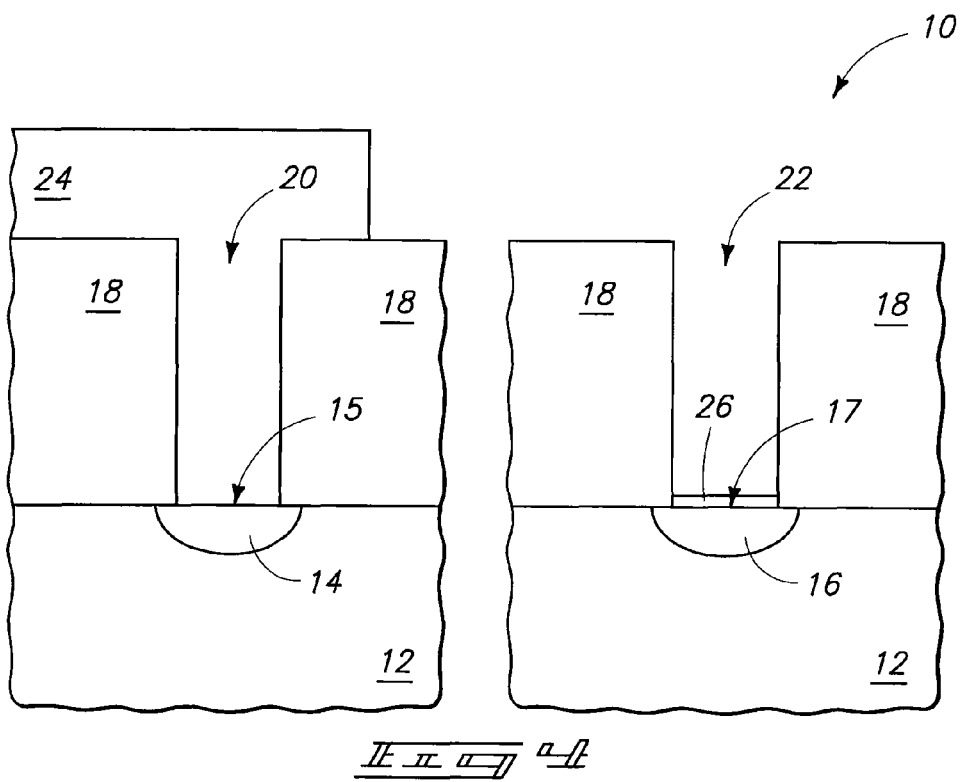
FIG. 4 is a view of the FIG. 1 wafer fragment at a processing step subsequent to that shown by FIG. 3.

Referring to FIG. 4 and while first conductor 14 is masked, an antifuse dielectric 26 has been formed within second via opening 22 over exposed second conductor 16 and not within the first via opening over the first conductor. In the depicted embodiment, antifuse dielectric 26 is shown as being received "on" (meaning in at least some direct physical touching contact) outermost surface 17 of second conductor 16. Any suitable dielectric material which can function as an antifuse dielectric is contemplated, including multiple different materials, and whether existing or yet-to-be developed. By way of examples only, examples include silicon nitride, silicon dioxide, high k dielectrics, etc. Material composition and thickness can be optimized and selected by the artisan depending upon the desired antifuse which will be formed. By way of examples only, example finished thickness for antifuse dielectric 26 might be anywhere from 10 Angstroms to 100 Angstroms thick.

Antifuse dielectric might be deposited by any of a number of manners, for example including atomic layer deposition, chemical vapor deposition, physical vapor deposition, evaporation, and any other technique whether existing or yet-to-be developed. In one embodiment and as shown in FIG. 4, formation of the antifuse dielectric might be by a selective process, for example, by selectively growing antifuse dielectric 26 upon outermost surface 17 of second conductor 16 as compared to other exposed surfaces of substrate 10. For example, an antifuse dielectric comprising silicon dioxide can be selectively thermally grown from a second conductor 16 which comprises silicon. Alternately by way of example only and as described subsequently, the antifuse dielectric might be formed by depositing one or more layers over the substrate in a blanket manner.

Referring to FIG. 5, first conductor 14 has been unmasked to be exposed through first via opening 20, for example by removal of masking material 24. Isotropic chemical etching is but one example technique for removing masking material 24, or for example $O_2$ ashing where masking material 24 comprises photoresist.

Referring to FIG. 6, conductive material 28 has been deposited to within first via opening 20 in electrically conductive connection with first conductor 14 and within second via opening 22 over antifuse dielectric 26. Such thereby, forms a conductive interconnect 30 within first via opening 20 to first conductor 14, and an antifuse 32 comprising second conductor 28, antifuse dielectric 26 within second via opening 22 and second conductor 16. Example conductive materials include one or more of conductively doped semiconductive material, elemental metal, metal alloys, and metal compounds. In the depicted example, conductive material 28 has been deposited to completely fill a remaining volume of first via opening 20 and second via opening 22, although such is of course not required. Regardless, in one embodiment, antifuse dielectric 26 received over the second conductor within second via opening 22 might be etched back prior to depositing of conductive material 28 to within second via opening 22. For example, it might be desirable to deposit the antifuse dielectric to a thickness greater than finally desired, and etch such back to a desired finished thickness. Regardless, any such etching might be conducted prior to or after any unmasking of the first conductor to expose it through the first via opening.

Figure 7:
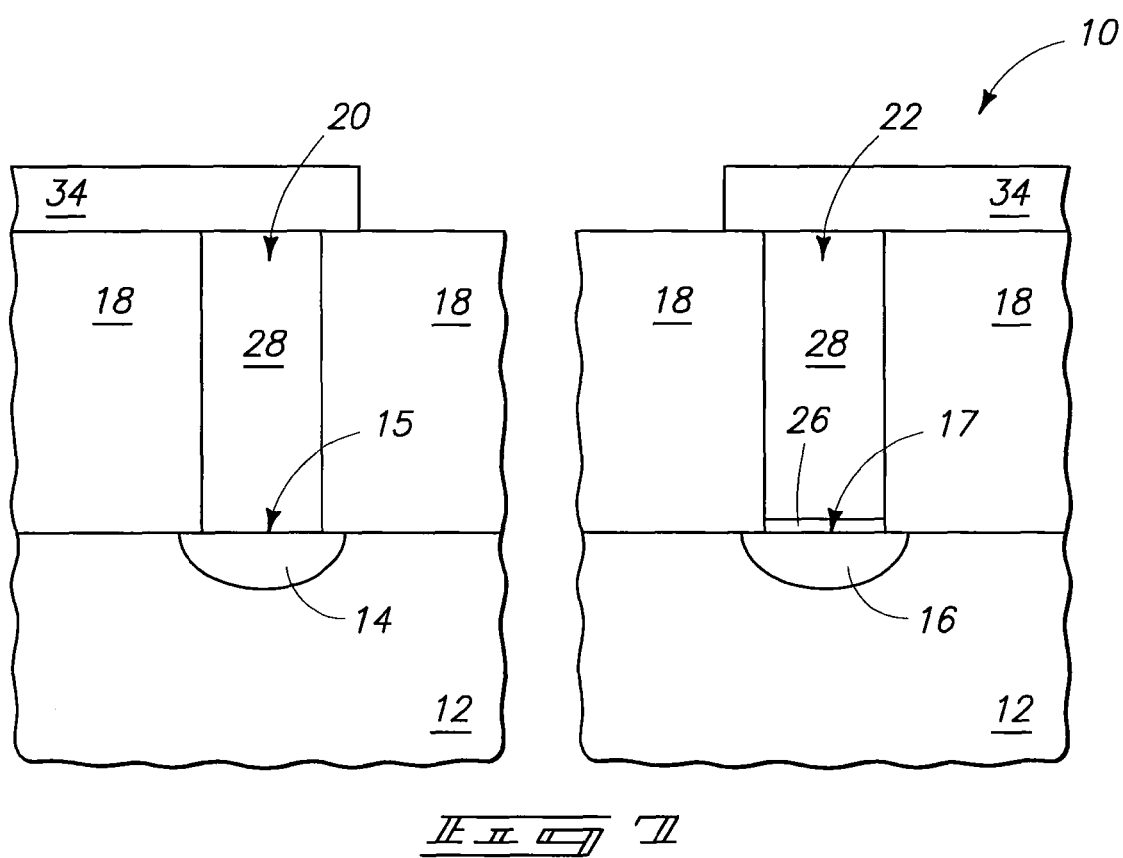
FIG. 7 is a view of the FIG. 1 wafer fragment at a processing step subsequent to that shown by FIG. 6.

Conductive material 28 might be subsequently processed, for example by patterning and etching to be formed into a suitable or desired conductive line or other shape. Alternately and by way of example only, FIG. 7 depicts conductive material 28 as having been removed back at least to an outermost surface of material 18 (for example, by etching and/or chemical mechanical polishing) to form isolated plugs of material 28 within first via opening 20 and second via opening 22. Subsequently, a suitable conductive layer 34 is depicted as having been deposited over substrate 10 and patterned to form desired respective conductive interconnecting lines to conductive interconnect 28 and to antifuse 32.

Figure 8:
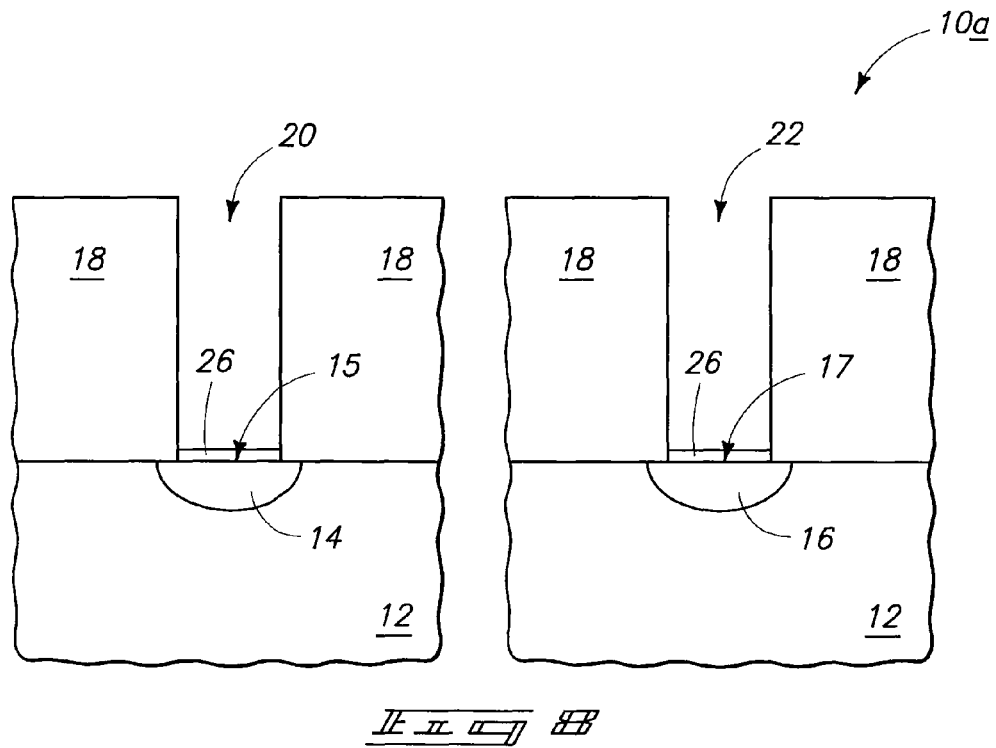
FIG. 8 is a diagrammatic sectional view of another wafer fragment in process in accordance with an embodiment of the invention.
Figure 9:
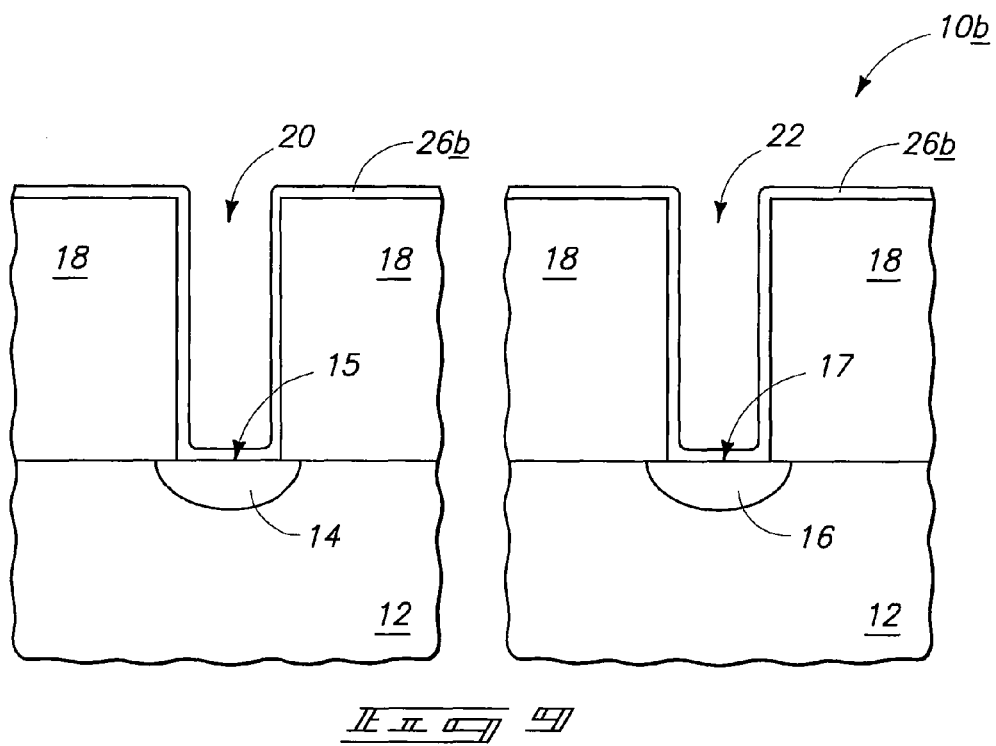
FIG. 9 is a diagrammatic sectional view of still another wafer fragment in process in accordance with an embodiment of the invention.

Additional example embodiments are next described in conjunction with FIGS. 8-19. Referring initially to FIG. 8, an alternate embodiment substrate 10a is depicted and corresponds in processing sequence to the first described embodiment just subsequent to the processing of FIG. 2. Like numerals from the first described embodiment have been utilized where appropriate, with differences being indicated with the suffix "a" or with different numerals. In FIG. 8, antifuse dielectric 26 has been formed within first via opening 20 over first conductor 14 and within second via opening 22 over second conductor 16. By way of example only, such depicts antifuse dielectric 26 as having been formed in a substantially selective manner relative to the outermost surfaces of first conductor 14 and second conductor 16. Alternate processing is of course contemplated, and as described above. For example, FIG. 9 depicts an alternate embodiment substrate 10b to that depicted in FIG. 8. Like numerals from the above-described embodiments have been utilized where appropriate, with differences being indicated with the suffix "b" or with different numerals. FIG. 9 depicts an antifuse dielectric layer 26b having been blanketly deposited over the substrate to line respective sidewalls of first and second via openings 20, 22, respectively, as well as being received over first conductor 14 and over second conductor 16.

Figure 10:
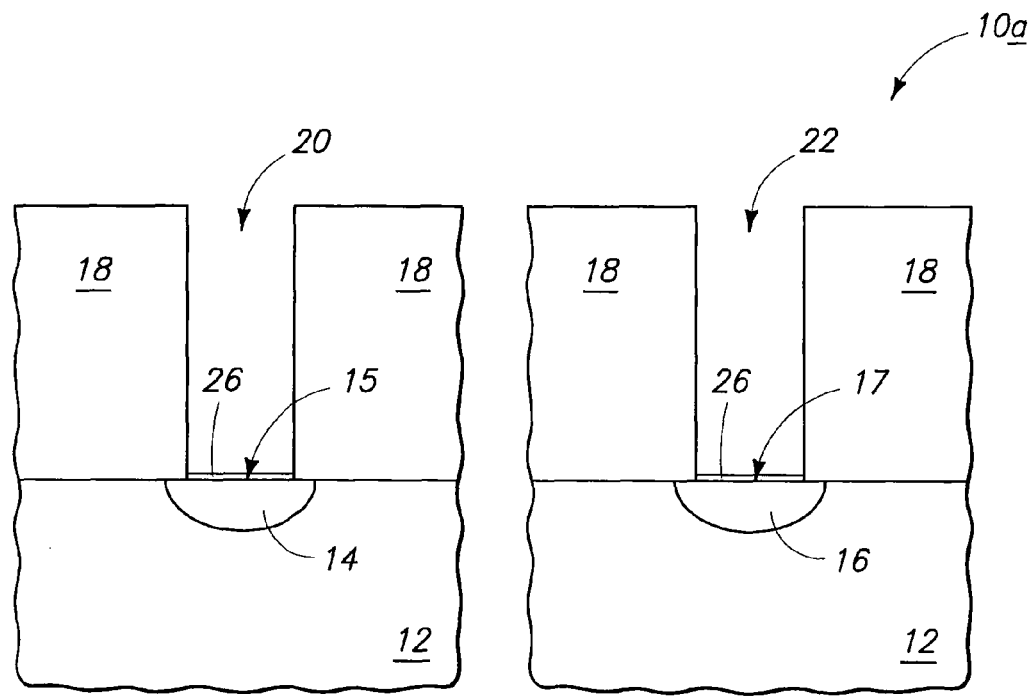
FIG. 10 is a view of the FIG. 8 wafer fragment at a processing step subsequent to that shown by FIG. 8.
Figure 11:
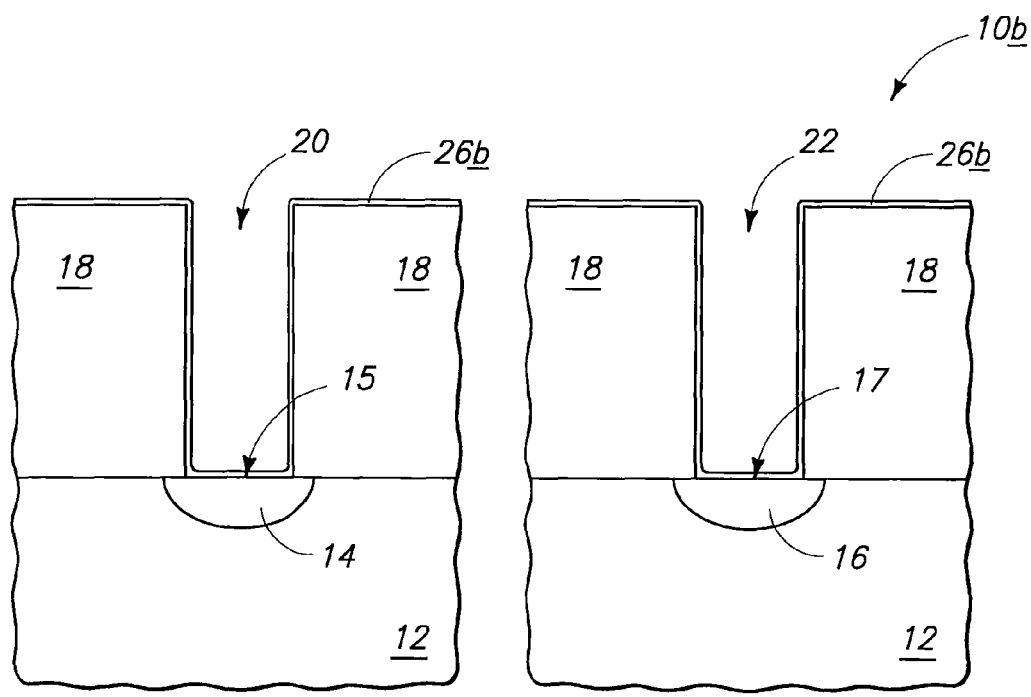
FIG. 11 is a view of the FIG. 9 wafer fragment at a processing step subsequent to that shown by FIG. 9.

Referring to FIGS. 10 and 11, some of antifuse dielectric 26/26b at least as received over second conductor 16 has been etched back. For example, it might be desirable to deposit the antifuse dielectric to a thickness greater than finally desired, and etch such back to a desired finished thickness.

Figure 12:
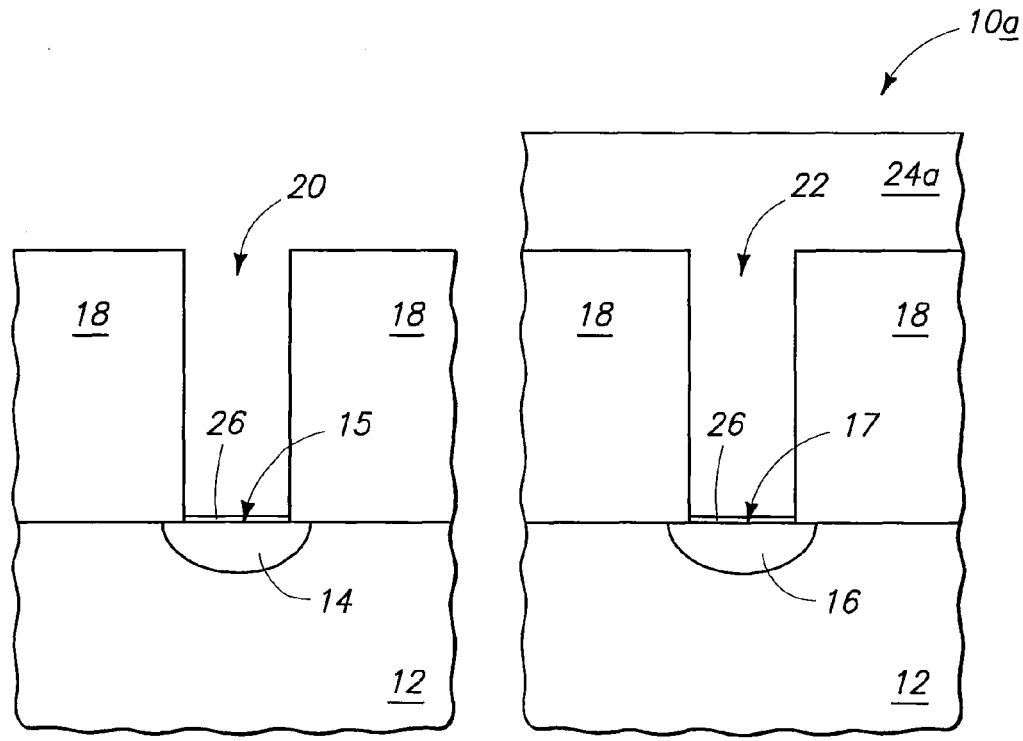
FIG. 12 is a view of the FIG. 8 wafer fragment at a processing step subsequent to that shown by FIG. 10.
Figure 13:
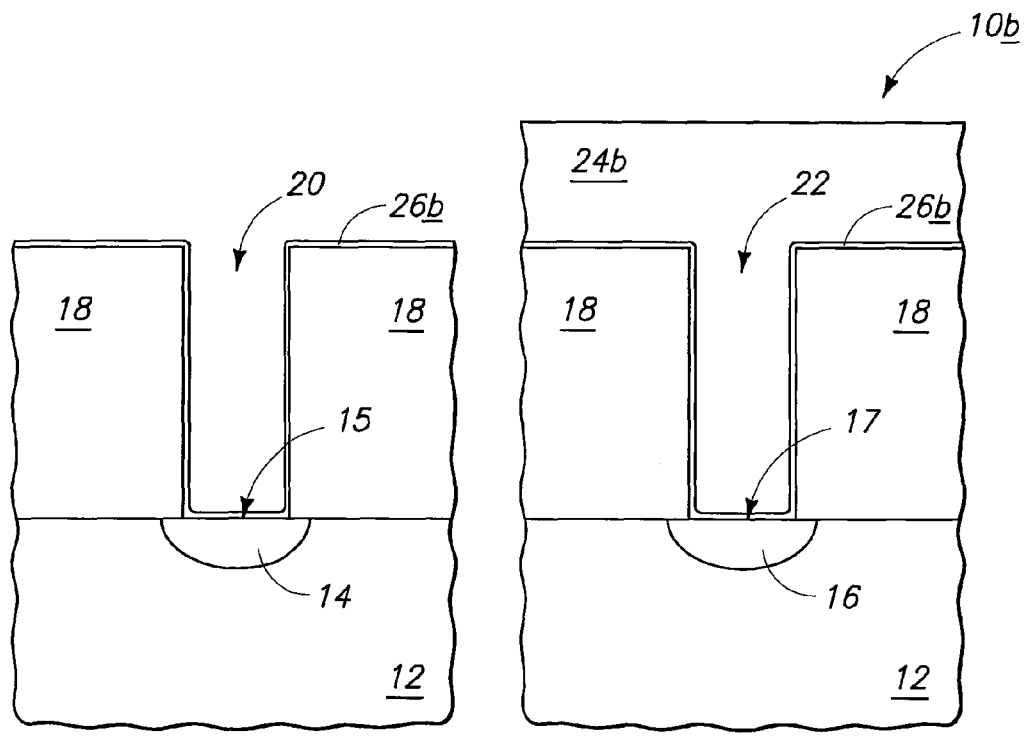
FIG. 13 is a view of the FIG. 9 wafer fragment at a processing step subsequent to that shown by FIG. 11.

Processing may be subsequently conducted whereby the antifuse dielectric material within the first via opening is removed from being received over the first conductor effective to outwardly expose the first conductor through the first via opening and leave the second conductor covered with the antifuse dielectric within the second via opening. For example, FIGS. 12 and 13 depict antifuse dielectric 26/26b within second via opening 22 has been masked with a suitable masking material 24a/24b and to leave antifuse dielectric 26/26b within first via opening 20 outwardly exposed.

Figure 14:
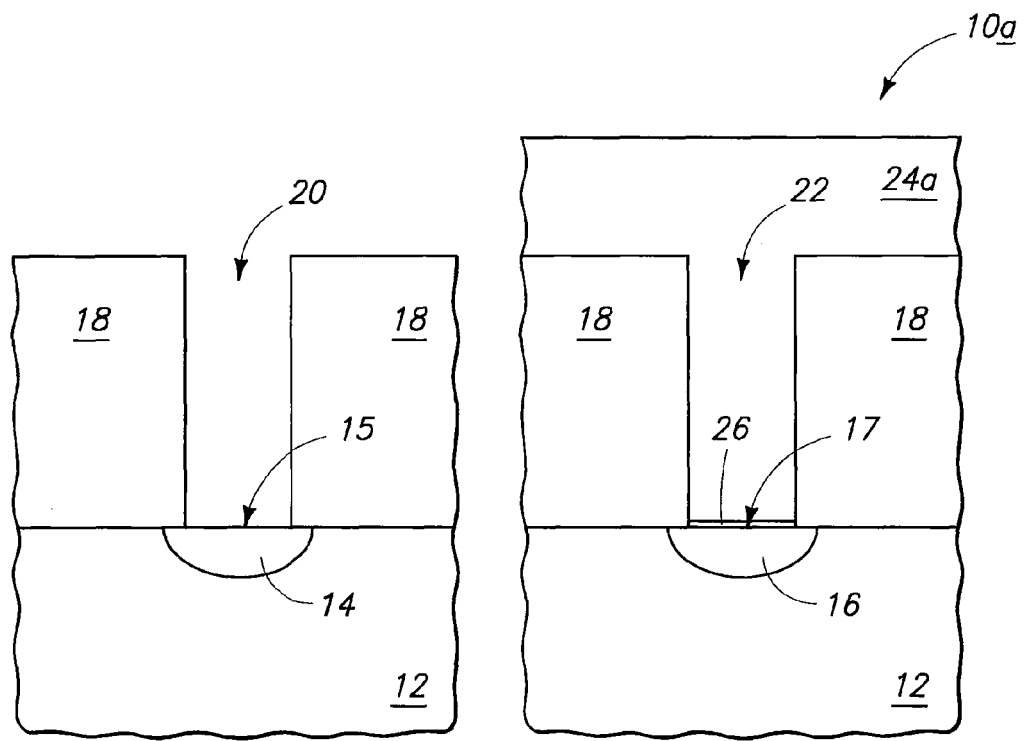
FIG. 14 is a view of the FIG. 8 wafer fragment at a processing step subsequent to that shown by FIG. 12.
Figure 15:
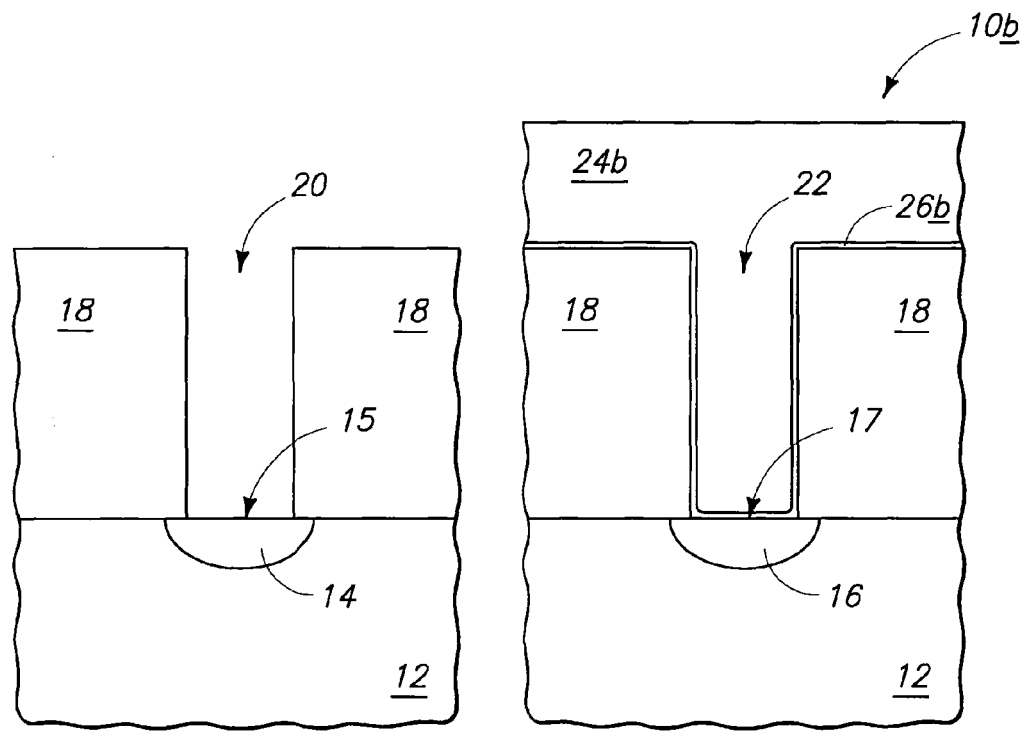
FIG. 15 is a view of the FIG. 9 wafer fragment at a processing step subsequent to that shown by FIG. 13.

Referring to FIGS. 14 and 15, antifuse dielectric 26/26b has been removed within first via opening 20 (not shown in via openings 20) from over first conductor 14 effective to outwardly expose first conductor 14 through first via opening 20 and leave second conductor 16 covered with antifuse dielectric 26/26b within second via opening 22. In the depicted example, all of antifuse dielectric 26/26b has been removed from within first via opening 20. Such might occur by any suitable technique, for example, etching using suitable dry and/or wet chemistry.

Figure 16:
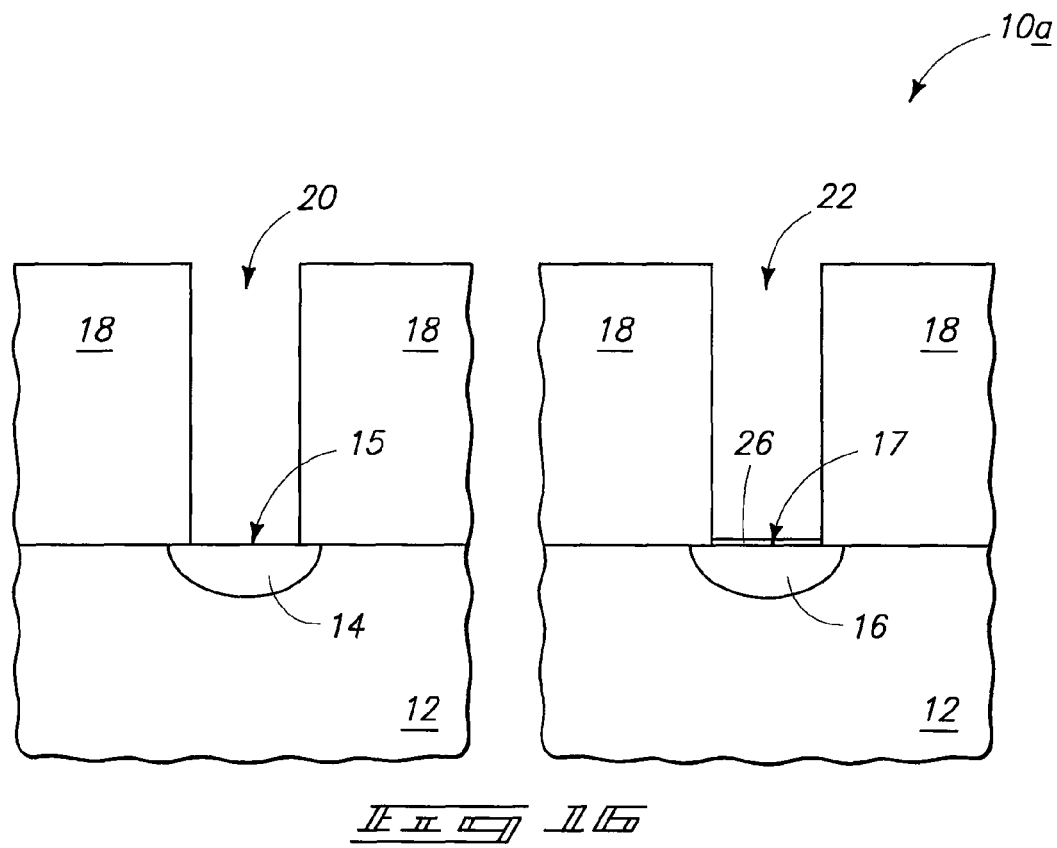
FIG. 16 is a view of the FIG. 8 wafer fragment at a processing step subsequent to that shown by FIG. 14.
Figure 17:
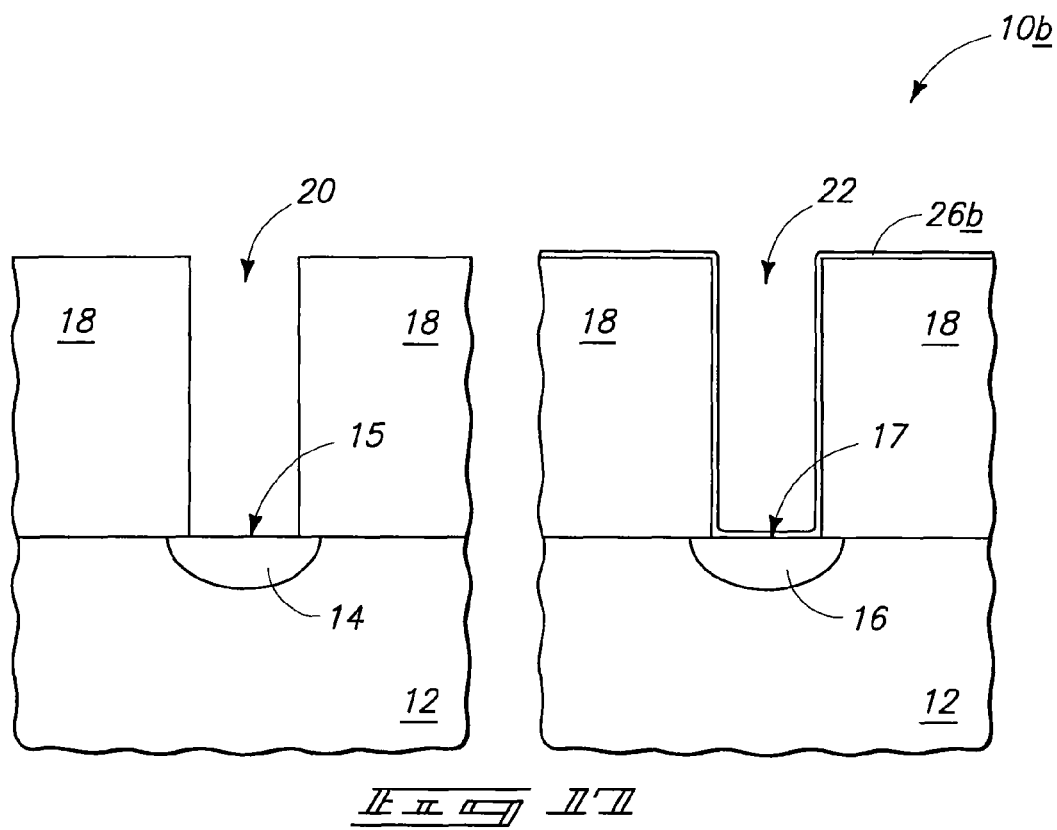
FIG. 17 is a view of the FIG. 9 wafer fragment at a processing step subsequent to that shown by FIG. 15.

Referring to FIGS. 16 and 17, masking material 24a/24b (not shown) have been removed from the respective substrates.

Figure 18:
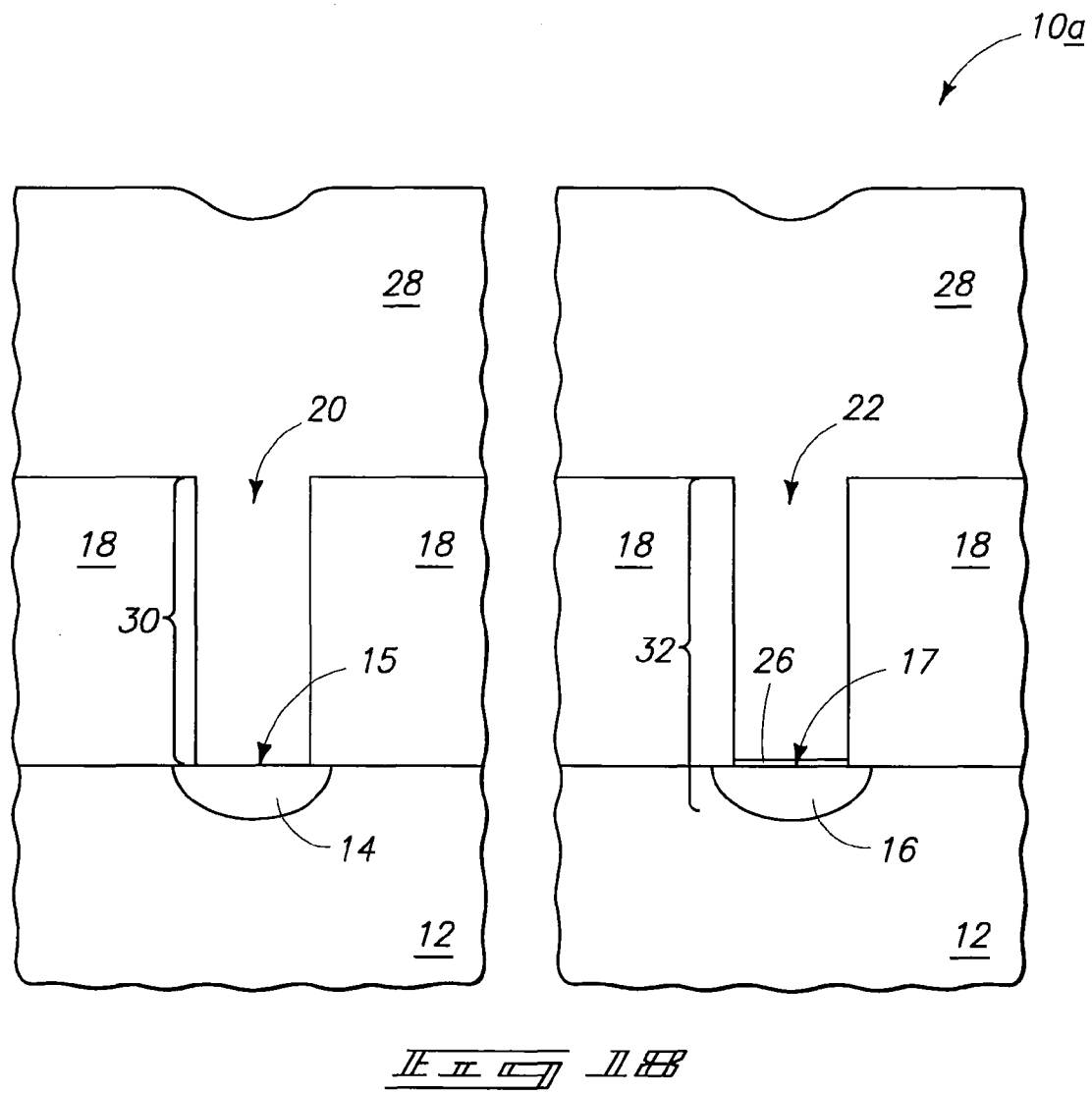
FIG. 18 is a view of the FIG. 8 wafer fragment at a processing step subsequent to that shown by FIG. 16.
Figure 19:
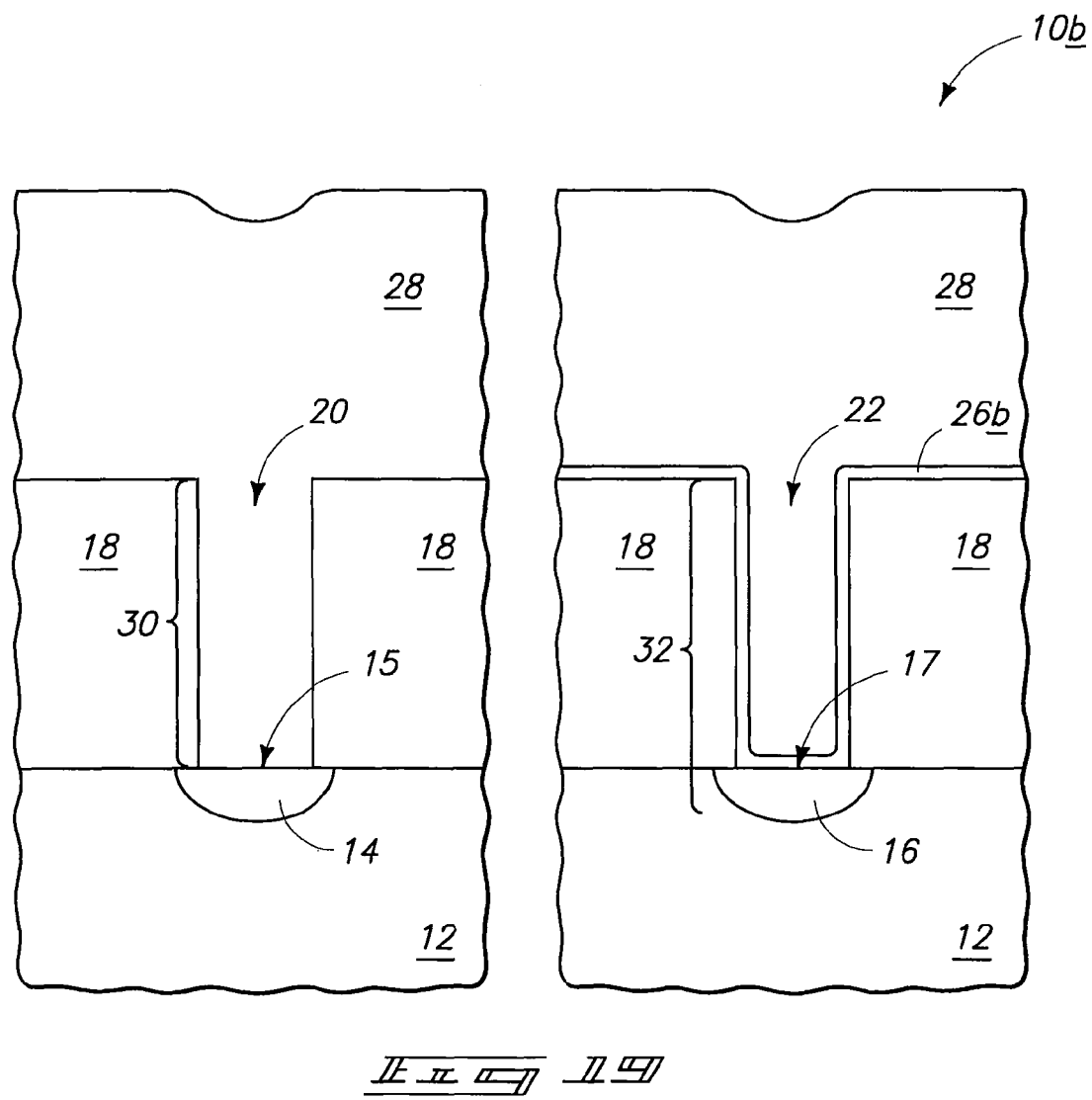
FIG. 19 is a view of the FIG. 9 wafer fragment at a processing step subsequent to that shown by FIG. 17.

Referring to FIGS. 18 and 19, conductive material 28 has been deposited to within first via opening 20 in electrical conductive connection with first conductor 14 and within second via opening 22 over antifuse dielectric 26/26b. Such thereby forms a conductive interconnect 30 within first via opening 20 to first conductor 14 and respective antifuses 32/32b within second via opening 22 which comprises second conductor 16, antifuse dielectric 26/26b and conductive material 28 deposited to within second via opening 22. Processing might otherwise occur subsequently as described above.

In the above example FIGS. 8-19 embodiments, some of antifuse dielectric 26/26b as received over second conductor 16 was etched back prior to the act of removing the antifuse dielectric from first via opening 20. Alternately, etching back some of the antifuse dielectric 26/26b as received over second conductor 16 within second via opening 22 might not occur, or additionally occur, after removing antifuse dielectric 26/26b from first via opening 20.

Figure 20:
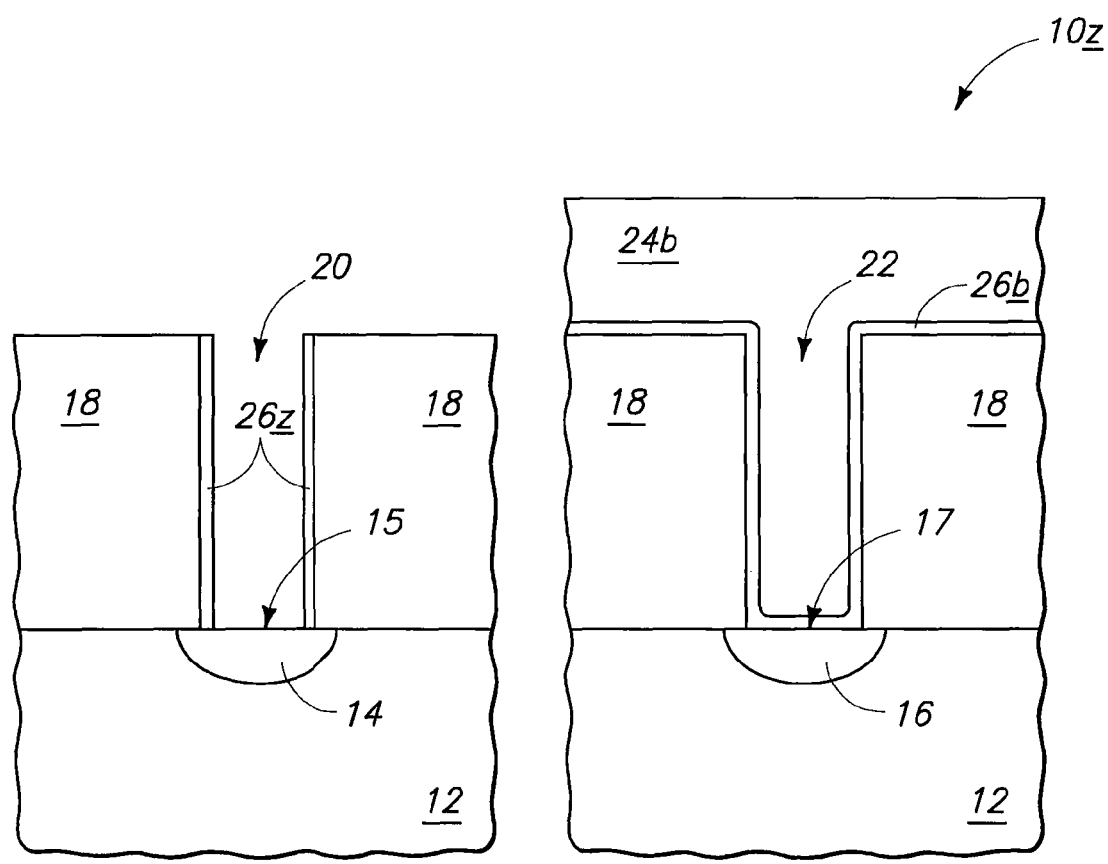
FIG. 20 is a diagrammatic sectional view of yet another wafer fragment in process in accordance with an embodiment of the invention.

Further in the above embodiment of FIGS. 9, 11, 13, 15, 17, and 19, all of antifuse dielectric 26b is shown as having been removed from first via opening 20 (FIG. 15). Alternately by way of example only, such antifuse dielectric might be etched from within the first via opening from being received over the first conductor between the lined sidewalls within the first via opening and to leave the sidewalls of the first via opening lined with said blanketely deposited antifuse dielectric, with the etching being effective to outwardly expose the first conductor through the first via opening and leaving the second conductor covered with the antifuse dielectric within the second via opening. For example FIGS. 20 and 21 show such an example alternate processing to FIGS. 13 and 19, respectively, with respect to an alternate embodiment substrate 10z. (Like numerals from the above described embodiments have been utilized where appropriate, with differences being indicated with the suffix "z" or with different numerals.)

Embodiments of the invention incorporate any of the above methods to form DRAM or other circuitry. Example embodiments of forming DRAM circuitry are next described with reference to FIGS. 22-29 in connection with a substrate 10c. Like numerals from the first described embodiments have been utilized where appropriate, with differences being indicated with the suffix "c" or with different numerals. Referring to FIG. 22, substrate 10c is depicted as comprising a memory array circuitry area 50 and a peripheral circuitry area 52. Peripheral circuitry area 52 comprises material 54 received over a base substrate 12. Material 54 would likely comprise multiple different materials, layers, and/or constructions. Memory array circuitry area 50 diagrammatically depicts example capacitor-over-bitline DRAM circuitry although other DRAM circuitry whether the capacitors are received above or below the bitline, and whether existing or yet-to-be developed, are also contemplated. Memory array circuitry area 50 comprises trench isolation regions 56 formed relative to a bulk substrate material 12, and having an active area 58 received between trench isolations 56 in the depicted cross-section. A plurality of word line field effect transistor gate constructions 60 is received over base substrate 12 and trench isolation regions 56. Details of construction of field effect transistor gate construction 60 are shown as comprising dielectric regions 91 and conductive regions 93. Conductive diffusion regions 62, 63, and 64 have been formed within active area 58. Bit lines are provided, typically running generally orthogonal to word line constructions 60. A bit line construction 66 having a lateral extension that is received over and in conductive electrical connection with diffusion region 63 is depicted as one example. Such by way of example only is depicted as comprising a conductive region 95 and dielectric regions 97. Insulative material 68 is received over and about bitline construction 66 and word line constructions 60. Via openings 69 and 70 have been formed therethrough to diffusion regions 62, 64, respectively, and such have been filled with conductive plugging material 72 to form conductive interconnects to diffusion regions 62 and 64.

An insulative layer 74 has been formed over insulator layer 68. Openings 75 have been formed therethrough to conductive material 72 within via openings 69 and 70. Example container-shaped DRAM capacitor storage nodes 76 have been formed within openings 75. A capacitor dielectric 78 has been formed over capacitor storage nodes 76 and insulator layer 74.

The above provides but one example embodiment of forming DRAM capacitor storage nodes having capacitor dielectric formed thereover within a memory array circuitry area of DRAM circuitry which is being formed. Any alternative constructions or processing are of course contemplated, and whether existing or yet-to-be developed. For example and by way of example only, other than container-shaped storage nodes might be utilized and some or all of the outer lateral sidewalls thereof might be exposed for providing increased capacitor surface area.

Referring to FIG. 23, conductive material 80 has been deposited commonly over both memory array circuitry area 50 and peripheral circuitry area 52 for forming a capacitor cell plate 82 which is common to/shared by a plurality of DRAM capacitors comprising the capacitor storage nodes in the memory array circuitry area 50, and to form a conductor 84 in peripheral circuitry area 52. For example, FIG. 23 depicts a pair of example DRAM capacitors 85 and 86, with capacitor cell plate 82 being common thereto/shared thereby.

Referring to FIG. 24, insulative material 18 has been deposited commonly over both capacitor cell plate 82 within memory array circuitry area 50 and conductor 84 in peripheral circuitry area 52.

Referring to FIG. 25, a first via opening 20 has been formed through insulative material 18 within memory array circuitry area 50 to capacitor cell plate 82, and a second via opening 22 has been formed through insulative material 18 within peripheral circuitry area 52 to conductor 84.

Referring to FIG. 26, capacitor cell plate 82 within memory array circuitry area 50 has been masked from being exposed through first via opening 20 and to leave conductor 84 within peripheral circuitry area 52 outwardly exposed through second via opening 22. Such has been conducted utilizing a masking material construction 24c, for example utilizing any of the techniques described above.

Figure 27:
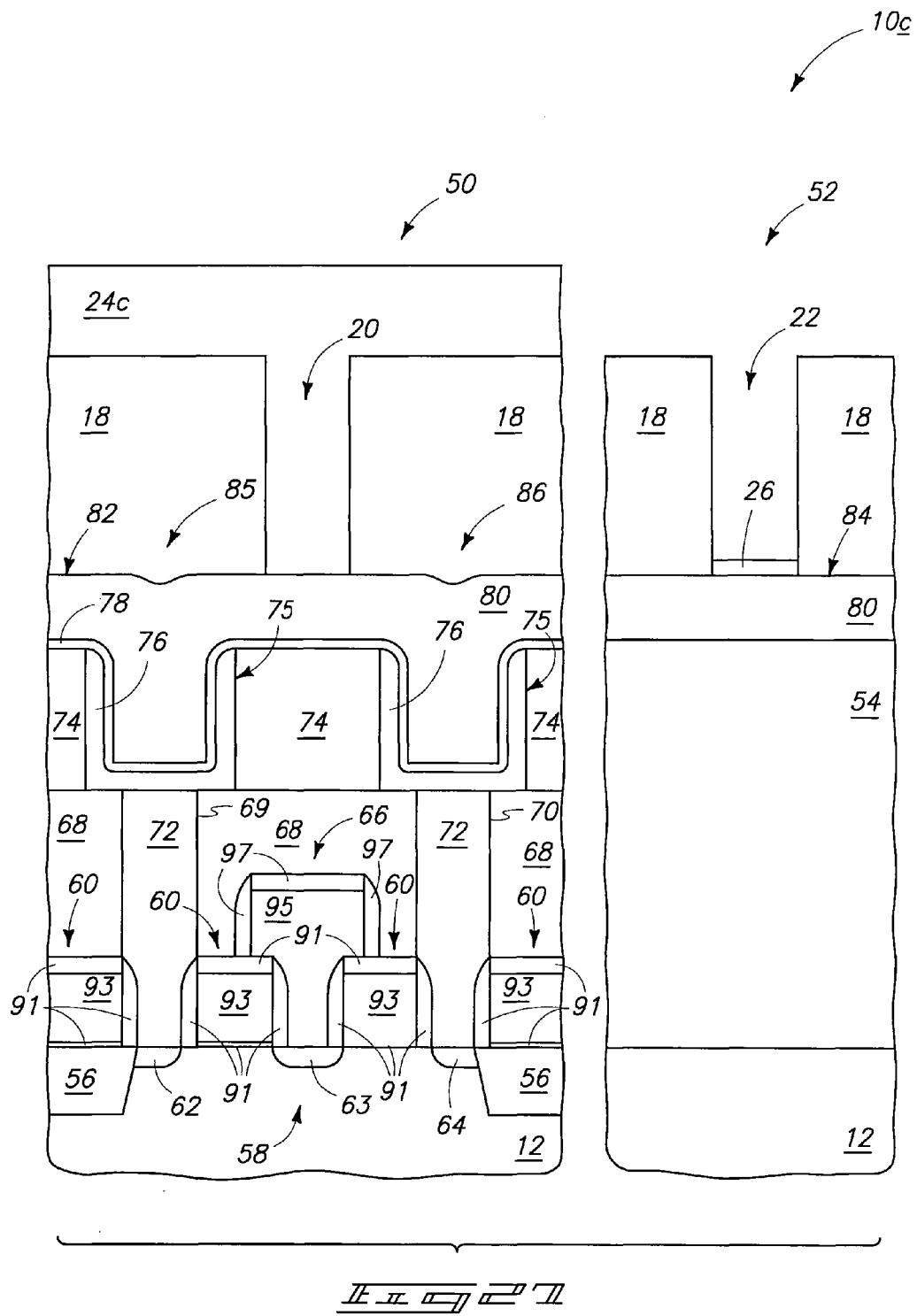
FIG. 27 is a view of the FIG. 22 wafer fragment at a processing step subsequent to that shown by FIG. 26.

Referring to FIG. 27 and while masking capacitor cell plate 82 within memory array circuitry area 50, an antifuse dielectric 26 has been formed within second via opening 22 within peripheral circuitry area 52 over exposed conductor 84 and not within first via opening 20 over capacitor cell plate 82 within memory array area 50. Processing might occur additionally or alternately in accordance with any of the above-described embodiments.

Figure 28:
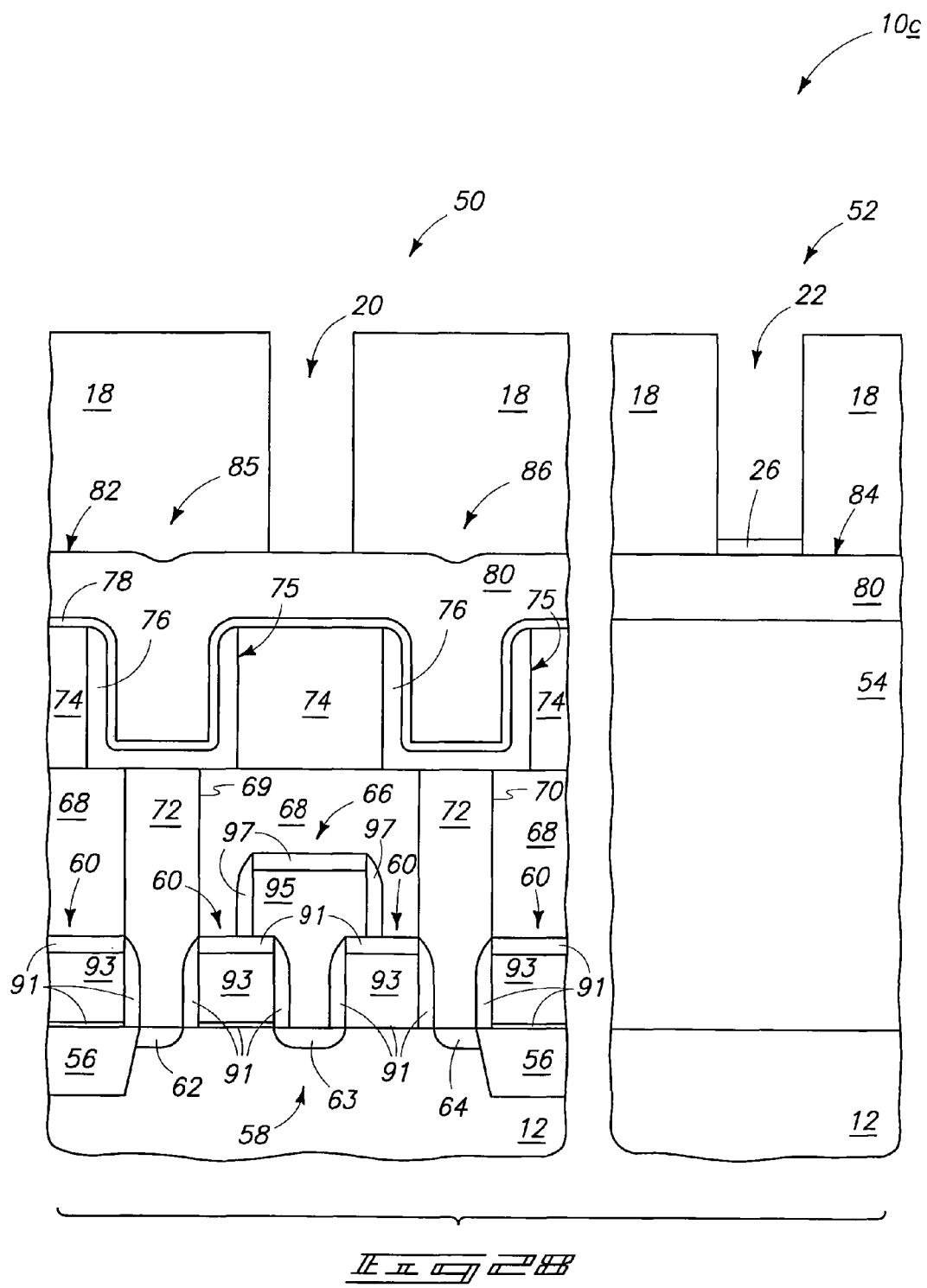
FIG. 28 is a view of the FIG. 22 wafer fragment at a processing step subsequent to that shown by FIG. 27.

Referring to FIG. 28, capacitor cell plate 82 within memory array circuitry area 50 has been unmasked to expose capacitor cell plate 82 through first via opening 20, for example by removing masking construction 24c (not shown).

Figure 29:
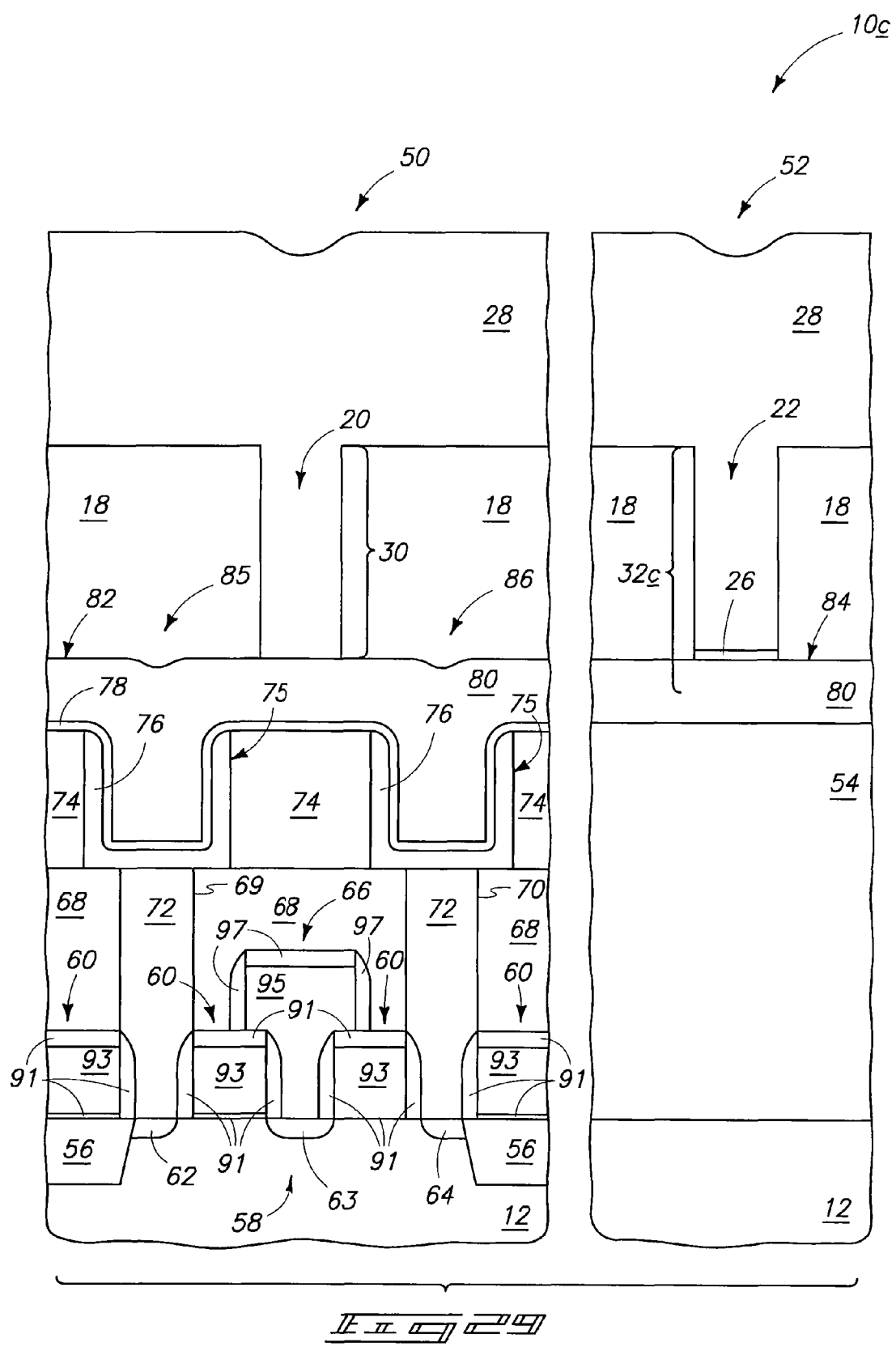
FIG. 29 is a view of the FIG. 22 wafer fragment at a processing step subsequent to that shown by FIG. 28.

Referring to FIG. 29, conductive material 28 has been deposited to within first via opening 20 within memory array circuitry area 50 in electrically conductive connection with capacitor cell plate 82 and to within second via opening 22 within peripheral circuitry area 52 over antifuse dielectric 26. Thereby, a conductive interconnect 30 is formed within first via opening 20 to capacitor cell plate 82 within memory array circuitry area 50, and an antifuse 32c is formed within peripheral circuitry area 52 which comprises conductor 84, antifuse dielectric 26 and conductive material 28 deposited to within second via opening 22.

Any of the above processing might also be conducted additionally or alternately to that described in connection with the FIGS. 22-29 embodiments. For example and by way of example only, the substrate of FIG. 25 might be processed differently to that depicted by FIG. 26 whereby an antifuse dielectric is formed within the first via opening within the memory array circuitry area over the capacitor cell plate and within the second via opening within the peripheral circuitry area over the conductor, for example, analogous to that shown and described above with reference to FIGS. 8 and/or 9. Subsequently, the antifuse dielectric within the first via opening within the memory array circuitry area would be removed from over the capacitor cell plate effective to outwardly expose the capacitor cell plate through the first via opening and leave the conductor covered with the antifuse dielectric within the second via opening within the peripheral circuitry area. For example and/or alternately, analogous processing to that shown and described above with connection with any of FIGS. 10-21, or otherwise, could occur. Thereafter, conductive material could be deposited to within the first and second via openings ultimately to form a desired conductive interconnect within the first via opening to the capacitor cell plate and to form an antifuse comprising the conductor, the antifuse dielectric within the second via opening and the conductive material deposited to within the second via opening.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an antifuse and a conductive interconnect, comprising:
   forming a first via opening to a first node location and a second via opening to a second node location, the first and second node locations being spaced apart from one another on a substrate;
   after forming the first and second via openings, masking the first node location from being exposed through the first via opening and to leave the second node location outwardly exposed through the second via opening;
   while masking the first node location, forming an antifuse dielectric within the second via opening over the exposed second node location and not within the first via opening over the first node location;

after forming the antifuse dielectric, unmasking the first node location to expose the first node location through the first via opening; and after said unmasking of the first node location, depositing conductive material to within the first via opening in conductive connection with the first node location and forming a conductive interconnect within the first via opening to the first node location and to within the second via opening over the antifuse dielectric and forming an antifuse comprising the second node location, the antifuse dielectric within the second via opening and the conductive material deposited to within the second via opening.

2. The method of claim 1 wherein the masking comprises depositing masking material to within the first via opening.

3. The method of claim 2 wherein the masking material is deposited to physically contact the first node location.

4. The method of claim 1 wherein the masking comprises depositing masking material to bridge across the first via opening.

5. The method of claim 4 wherein the masking comprises depositing masking material to within the first via opening.

6. A method of forming an antifuse and a conductive interconnect, comprising:

forming a first via opening to a first node location and a second via opening to a second node location, the first and second node locations being spaced apart from one another on a substrate;

after forming the first and second via openings, masking the first node location from being exposed through the first via opening and to leave the second node location outwardly exposed through the second via opening;

forming an antifuse dielectric within the second via opening over the exposed second node location;

after forming the antifuse dielectric, unmasking the first node location to expose the first node location through the first via opening;

after the unmasking, etching back some of the antifuse dielectric received over the second node location within the second via opening; and after said etching back some of the antifuse dielectric, depositing conductive material to within the first via opening in conductive connection with the first node location and forming a conductive interconnect within the first via opening to the first node location and to within the second via opening over the antifuse dielectric and forming an antifuse comprising the second node location, the antifuse dielectric within the second via opening and the conductive material deposited to within the second via opening.

7. A method of forming an antifuse and a conductive interconnect, comprising:

forming a first via opening to a first node location and a second via opening to a second node location, the first and second node locations being spaced apart from one another on a substrate;

after forming the first and second via openings, forming an antifuse dielectric within the first via opening over the first node location and within the second via opening over the second node location;

removing the antifuse dielectric within the first via opening from over the first node location to outwardly expose the first node location through the first via opening and leaving the second node location covered with the antifuse dielectric within the second via opening;

etching back some of the antifuse dielectric received over the second node location within the second via opening; and after said removing of the antifuse dielectric within the first opening and after said etching back some of the antifuse dielectric received over the second node location within the second via opening, depositing conductive material to within the first via opening in conductive connection with the first node location and forming a conductive interconnect within the first via opening to the first node location and to within the second via opening over the antifuse dielectric and forming an antifuse comprising the second node location, the antifuse dielectric within the second via opening and the conductive material deposited to within the second via opening.

8. The method of claim 7 comprising forming said antifuse dielectric by depositing antifuse dielectric over the substrate in a blanket manner.

9. The method of claim 7 comprising forming said antifuse dielectric by selectively growing the antifuse dielectric upon outermost surfaces of the first node location and the second node location.

10. The method of claim 7 wherein the first and second node locations comprise respective outermost surfaces received at the same elevation relative the substrate and to which the respective first and second via openings extend.

11. The method of claim 7 wherein the first and second node locations comprise respective outermost surfaces received at different respective elevations relative the substrate and to which the respective first and second via openings extend.

12. The method of claim 7 wherein the etching is conducted prior to the removing.

13. The method of claim 12 comprising etching back some of the antifuse dielectric received over the first node location within the first opening while etching back some of the antifuse dielectric received over the second node location within the second via opening.

14. The method of claim 7 wherein the etching is conducted after the removing.

15. A method of forming an antifuse and a conductive interconnect, comprising:

forming a first via opening to a first node location and a second via opening to a second node location, the first and second node locations being spaced apart from one another on a substrate;

after forming the first and second via openings, blanketly depositing antifuse dielectric over the substrate and to within the first via opening over the first node location and within the second via opening over the second node location, the antifuse dielectric lining respective sidewalls of the first and second via openings;

masking the antifuse dielectric within the second via opening and to leave the antifuse dielectric within the first via opening outwardly exposed;

etching the antifuse dielectric from within the first via opening from being received over the first node location between the lined sidewalls within the first via opening and to leave the sidewalls of the first via opening lined with said blanketely deposited antifuse dielectric, said etching exposing the first node location through the first via opening and leaving the second node location covered with the antifuse dielectric within the second via opening; and after said removing of the antifuse dielectric within the first opening, depositing conductive material to within the first via opening in conductive connection with the first node location and forming a conductive interconnect within the first via opening to the first node location and to within the second via opening over the antifuse dielectric and forming an antifuse comprising the second node location the antifuse dielectric within the second via opening and the conductive material deposited to within the second via opening.

16. The method of claim 2 wherein the masking comprises filling the first via opening with the masking material.

17. The method of claim 2 wherein the masking comprises less than filling the first via opening with the masking material.

18. The method of claim 17 wherein the masking lines sidewalls of the first via opening with the masking material.

19. The method of claim 2 wherein the first and second via openings are formed within insulative material, the masking material not being received elevationally outward of the insulative material while forming the antifuse dielectric within the second via opening.

20. The method of claim 1 comprising etching back the antifuse dielectric prior to the unmasking.

21. The method of claim 1 comprising etching back the antifuse dielectric after the unmasking.

* * * * *

UNITED STATES PATENT AND TRADEMARK OFFICE
CERTIFICATE OF CORRECTION

| | | |
|---|---|---|
| PATENT NO. | : 7,888,255 B2 | |
| APPLICATION NO. | : 12/762766 | |
| DATED | : February 15, 2011 | |
| INVENTOR(S) | : Jasper Gibbons et al. | |

It is certified that error appears in the above-identified patent and that said Letters Patent is hereby corrected as shown below:

IN THE CLAIMS:

In column 10, line 60, in Claim 15, delete "blanketely" and insert -- blanketly --, therefor.

Signed and Sealed this
Nineteenth Day of April, 2011

David J. Kappos
*Director of the United States Patent and Trademark Office*